United States Patent
Huff

(10) Patent No.: US 6,477,208 B1
(45) Date of Patent: *Nov. 5, 2002

(54) COMPOSITE TRELLIS SYSTEM AND METHOD

(75) Inventor: Ronald J Huff, Sunnyvale, CA (US)

(73) Assignee: ComTier, Sunnyvale, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 09/651,302

(22) Filed: Aug. 30, 2000

Related U.S. Application Data

(63) Continuation-in-part of application No. 09/418,698, filed on Oct. 15, 1999, now abandoned, which is a continuation of application No. 08/961,324, filed on Oct. 30, 1997, now Pat. No. 5,974,091.

(51) Int. Cl.[7] .............................. H04L 5/12; H04L 23/02

(52) U.S. Cl. ..................... 375/265; 714/786; 714/796

(58) Field of Search .................................. 375/265, 262, 375/316, 340, 341, 346, 348, 349; 370/321; 714/786, 792, 795, 796

(56) References Cited

U.S. PATENT DOCUMENTS

| | | | |
|---|---|---|---|
| 5,291,499 A | 3/1994 | Behrens et al. | 371/43 |
| 5,303,263 A | 4/1994 | Shoji et al. | 375/11 |
| 5,390,198 A | 2/1995 | Higgins | 371/43 |
| 5,414,738 A | 5/1995 | Bienz | 375/341 |
| 5,638,408 A | 6/1997 | Takaki | 375/341 |
| 5,774,500 A | 6/1998 | Zogakis et al. | 375/261 |
| 5,784,417 A | 7/1998 | Alamouti | 375/341 |

FOREIGN PATENT DOCUMENTS

| | | | |
|---|---|---|---|
| EP | 0913950 | 5/1999 | H03M/13/00 |

OTHER PUBLICATIONS

R. Sadr and J. Omura, "Generalized Minimum Shift–Keying Modulation Techniques", *IEEE Transactions on Communications*, vol. 36, No. 1, Jan. 1988, pp. 32–40.

M. Morelli, U. Mengali and G. Vitetta, "Joint Phase and Timing Recovery With CPM Signals", *IEEE Transactions on Communications*, vol. 45, No. 7, Jul. 1997, pp. 867–876.

*Primary Examiner*—Jean Corrielus
(74) *Attorney, Agent, or Firm*—Fenwick & West LLP

(57) ABSTRACT

This invention provides a method and apparatus for processing a received digitally-modulated carrier signal to coherently demodulate or, for some applications, coherently demodulate and decode said signal when the signal's phase has an undesired component and/or to generate successive estimated values of said undesired phase of the received signal. Signal processing operations are performed in accord with a composite trellis diagram formed from one or more component trellis diagrams that are phase-displaced versions of a root trellis diagram and, when applicable, phase migration transitions. Desired variations in signal parameter values that result from modulating the signal effect transitions between states in the root trellis diagram. For some embodiments of this invention, phase migration transitions which typically recur periodically in the composite trellis diagram accommodate undesired variations in the received signal's phase for which the rate of change in phase is adequately small relative to the modulation rate but not otherwise restricted. The applicable signal processing is implemented through appropriate application of the Viterbi maximum likelihood processing algorithm or any variant, derivative or counterpart thereof. A demodulated data sequence and/or a sequence of estimated values of the received signal's phase are derived from appropriately structured path history values generated for the multiple states in the composite trellis diagram. The received signal processed may have a continuous envelope or may be comprised of a succession of non-overlapping signal bursts which originate at one or more transmit locations, e.g., as in a TDMA system.

76 Claims, 21 Drawing Sheets

OTHER PUBLICATIONS

Y. Kong Some and P. Yuen Kam, "Efficient Estimation of Continuous Phase Modulation With Unkown Carrier Phase", *IEEE Transactions on Communications*, vol. 45, No. 7, Jul. 1997, pp. 765–767.

J. Liebetreu, "Joint Carrier Phase Estimation and Data Detection Algorithms for Multi–h CPM Data Transmission", *IEEE Transactions on Communications*, vol. Com–34, No. 9, Sep. 1986, pp. 873–881.

L. Scharf, D. Cox and C. Johan Masreliez, "Modulo–2Π Phase Sequence Estimation", *IEEE Transactions on Information Theory*, vol. IT–26, No. 5, Sep. 1980, pp. 615–620.

Adachi, F., "Reduced–state Viterbi differential detection using a recursively estimated phase reference for M–ary DPSK," *IEE Proeedings: Communications*, Institution of Electrical Engineers, vol. 142, No. 4, Aug. 1, 1995, pp. 263–270.

SIGNAL MODULATION PHASE VERSUS TIME FOR 4-ARY, 1REC CPFSK, h = 1/4

FOUR-STATE ROOT TRELLIS DIAGRAM FOR 4-ARY, 1REC CPFSK, h = 1/4

FOUR-STATE ROOT TRELLIS DIAGRAM FOR 4-ARY, 1REC CPFSK, h = 1/4

DATA STRUCTURES FOR DATA PATH HISTORY AND TRELLIS ID PATH HISTORY VALUES

ONE-STATE ROOT TRELLIS DIAGRAM FOR QPSK

COMPOSITE TRELLIS SYSTEM AND METHOD

CROSS-REFERENCE TO RELATED APPLICATIONS

This application is a continuation-in-part of now abandoned U.S. patent application Ser. No. 09/418,698, "Composite Trellis System and Method," by Ronald J Huff, filed Oct. 15, 1999; which is a continuation of U.S. patent application Ser. No. 08/961,324, "Composite Trellis System and Method," by Ronald J Huff, filed Oct. 30, 1997, now issued on Oct. 26, 1999 as U.S. Pat. No. 5,974,091. The subject matter of both of the foregoing is incorporated herein by reference.

BACKGROUND OF THE INVENTION

1. Field of the Invention

This invention relates generally to communication systems wherein modulated carrier signals convey data in digital form and more particularly to the implementation of coherent demodulators and signal phase estimators for such systems that must accommodate undesired signal-phase values and temporal variations thereof.

2. Description of the Related Art

In many carrier-based communication systems the transmit signals used to convey information are of the form $$s_{tx}(t_{tx}) = A_{tx}(t_{tx}) \cdot \sin[\omega_{c\ tx} \cdot t_{tx} + \phi_{m\ tx}(t_{tx})] \quad (1)$$

where $t_{tx}$ represents (relative) transmit time, $\omega_{c\ tx}$ represents the transmit radian carrier frequency in radians per second, $\phi_{m\ tx}(t_{tx})$ represents signal phase variations attributable to any phase modulation effected and $A_{tx}(t_{tx})$ represents the signal's amplitude. When the information transmitted is digital in form, the time continuum is generally divided into a succession of contiguous signaling (modulation) intervals and, for each signaling interval, $\log_2 m$ (uncoded or coded) data bits select one of m pre-specified options for varying the signal's phase and/or amplitude during the signaling interval. For this invention, the signal's phase may be varied (modulated) to convey digital data using any one of many different modulation methods including m-ary phase shift keying (PSK), m-ary continuous-phase frequency shift keying (CPFSK) and m-ary CPFSK with modulation and convolutional data encoding effected jointly. The signal's amplitude may vary with time as a consequence of implementing an amplitude modulation method such as m-ary amplitude shift keying (ASK) or incidentally, e.g., due to signal filtering effected. For m-ary ASK, modulation phase component $\phi_{m\ tx}(t_{tx})$ has a constant value considered herein to be zero radian. This invention also applies to several modulation methods for which signal amplitude and signal phase are varied jointly to convey digital data as for m-ary quadrature amplitude modulation (QAM).

For each of several modulation methods, the transmitted signal can be modeled equivalently as either a phase modulated signal or an amplitude-modulated signal where the signal amplitude is either a real or complex-valued function of time. Such methods are considered to be phase modulation methods herein irrespective of the means used to generate the signals transmitted. Further, for communication systems wherein digital data are transmitted via signaling bursts rather than continuously—as in time division multiple access (TDMA) systems—a transmit signal is modeled by assigning a value of zero to the signal's amplitude whenever signal transmission is disabled.

A transmit signal propagates from its point of origin to one or more receiver locations via one or more communication channels comprised of wire-line, wireless or electronic relay means, or any combination thereof. For a transmit signal representable by Equation 1, a signal received at a receiver location is of the form $$s_{rx}(t) = s(t) + n_\Sigma(t) \quad (2)$$

where t represents (relative) receive time, s(t) is a delayed, attenuated and generally-distorted version of the transmit signal, $$s(t) = A(t) \cdot \sin[\omega_c \cdot t + \phi_m(t) + \phi_u(t)], \quad (3)$$

and $n_\Sigma(t)$ represents a sum of noise and undesired signals which exacerbate generation of an exact (delayed) replica of the transmit data at the receiver. In accord with common practice, radian carrier frequency $\omega_c$ is assumed to be perfectly known at the receiver; frequency uncertainties that result from imperfect frequency synthesis within transmit, relay and receive subsystems and any doppler shift experienced by the signal in propagating to the receiver are considered to affect the value of signal phase $\phi_u(t)$: a phase variation that is unintended and undesired. Signal parameter $\omega_m(t)$ represents the modulation component of the received signal's phase when phase modulation is effected; otherwise, its value is considered herein to equal zero radian.

For a communication system wherein undesired signal-phase $\phi_u(t)$ can be made to vary slowly relative to and be distinguishable from phase $\phi_m(t)$, the most effective use of signal power can generally be achieved by employing a coherent demodulator to process the received signal. Ideally, a portion of the receiver would generate an exact replica of signal phase $\phi_u(t)$ and subtract this replica from the phase of the received signal to form a signal that exhibits no undesired phase variations; the latter signal would then be demodulated coherently to generate a nominal replica of the transmitted data stream. For many classes of modulation methods, prior art provides means for coherently demodulating signals which exhibit no undesired phase variations that can be implemented effectively whenever time intervals spanned by received modulation symbols, modulation intervals, can be accurately determined at the receiver's location.

In practice, undesired signal-phase $\phi_u(t)$ cannot be replicated exactly at a receiver location, but an estimate of $\phi_u(t)$ can often be generated with sufficient accuracy to allow the implementation of nearly-ideal coherent demodulation—particularly when m-ary PSK is used to generate signal modulation phase $\phi_m(t)$. For ideal (unfiltered) m-ary PSK, the signal's amplitude has a constant value and $\phi_m(t)$ assumes any one of m phases that are equally spaced in a $2\pi$ radians phase range during each modulation interval. As is well known, an $m^{th}$-order nonlinear device having a received m-ary PSK signal applied to its input port and a bandpass filter that rejects undesired components in the nonlinear device's output signal can generate a signal having a radian center frequency of $m \cdot \omega_c$ and phase $m \cdot \phi_u(t)$ accompanied by a noise signal that derives from the $n_\Sigma(t)$ component of the received signal. That is, an $m^{th}$-order nonlinear device provides a means for distinguishing $m \cdot \phi_u(t)$ from $\phi_m(t)$ when m-ary PSK is implemented. The nonlinear device's output signal is typically filtered by a relatively narrow-band phase-lock loop to generate a sufficiently accurate estimate of phase $m \cdot \phi_u(t)$ notwithstanding the presence of noise in the received signal. An ambiguous estimate of phase $\phi_u(t)$ can be determined there from by effectively dividing $m \cdot \phi_u(t)$ by m.

An m-fold ambiguity that derives from the divide operation is generally accommodated by either 1) differentially encoding the transmit data stream and differentially decoding the demodulated data stream in a manner appropriated for the value of m implemented or 2) periodically embedding a priori specified symbols within the transmit date stream which replicate properly in the demodulator only when the appropriate one of m ambiguous phase values is selected. Alternatively, phase-lock loops that incorporate other forms of nonlinearities to distinguish $\phi_u(t)$ from $\phi_m(t)$, e.g., a Costas loop, can be used to provide the desired phase estimate when m-ary PSK modulation is employed.

Phase-lock loops that incorporate nonlinearities as described in the preceding paragraph have attributes that limit system performances—particularly when burst signals are used to convey data as in TDMA systems. As is well known, the time required for a phase-lock loop to achieve lock is statistically distributed and occasionally exceeds the mean acquisition time by a considerable amount (such an event is referred to as a phase-lock loop hang-up), and the noise component of the received signal occasionally causes a locked loop to cycle slip, i.e., to lose and regain lock in a manner whereby the accumulated phase of the loop's output signal differs from the accumulated phase of the (multiplied) signal being tracked by one or more cycles. Further, as the nonlinearity order—the value of m—is increased, the power spectral density of the noise signal at the output of the nonlinearity increases relative to the level of the desired output signal because a larger number of signal by noise products are generated. Correspondingly, the bandwidth of the signal phase tracking loop must be made increasingly narrow relative to the modulation symbol transmission rate to achieve acceptable steady-state performance. Filtering an m-ary PSK transmit signal to reduce spectral sidelobe levels can also cause tracking-loop performance to degrade.

For a TDMA system wherein estimates of carrier frequency, carrier phase and modulation interval timing are generated at the beginning of each received signal burst by processing preamble symbols (before data demodulation is initiated), making the bandwidths of tracking loops sufficiently small to achieve acceptable steady-state performance can necessitate the use of an unacceptably long burst preamble. For a symbol-synchronous TDMA system, i.e., for a TDMA system wherein signal modulation symbol time bases and carrier frequencies are maintained in accurate synchronism with the time base and frequency, respectively, of a (pulsed-envelope) network timing signal, the transmission of burst preambles can be avoided by converting the received signal bursts into digitally represented sample sequences that are stored in digital memory and implementing "multiple-pass" digital processing. Typically, in-phase and quadrature components of the received signal are integrated over each modulation interval and converted into digital form or, equivalently, appropriate digitized signal sample values are summed to generate the sample sequences processed. Paired in-phase and quadrature sample values are interpreted as vectors from which vectors that have phase angles equal to m times the sample vector angles are generated and processed digitally over a sliding processing window to form estimated values of $m \cdot \phi_u(t)$ modulo $2\pi$ radians. These values are divided by m to generate estimated values of $\phi_u(t)$ that exhibit an m-fold ambiguity. In turn, stored (delayed) sample vectors are rotated in phase as appropriate to correct for the estimated undesired signal-phase values and the phase-corrected sample vectors are demodulated to generate a received data sequence. Of course, such multiple-pass digital processing does not circumvent the fundamental limitations of $m^{th}$-order nonlinear phase estimation methods.

Estimation of an undesired signal-phase component can similarly be accomplished when certain combinations of phase and amplitude modulations are used to convey data, e.g., as for selected forms of QAM. However, important modulation methods are incompatible with the use of non-linear processing to distinguish undesired signal-phase variation $\phi_u(t)$ from signal phase modulation $\phi_m(t)$—including most forms of m-ary CPFSK. Circumvention of $m^{th}$-order nonlinear processor performance limitations is also of interest.

One alternative approach to distinguishing $\phi_u(t)$ from $\phi_m(t)$ relies on estimation of $\phi_m(t)$ and, effectively, subtraction of the estimated modulation phase from the phase of the received signal to generate a signal that, ideally, would exhibit phase variations $\phi_u(t)$ only. Estimators that incorporate this alternative approach are often referred to as either decision-directed estimators or data-aided estimators. Their utility derives from the premise that sufficiently accurate estimation of $\phi_u(t)$ can be accomplished using an estimate of $\phi_m(t)$ that is not sufficiently accurate for demodulation purposes—at least whenever the error in the locally generated estimate of $\phi_u(t)$ is large. Proper operation of a decision-directed estimator requires that the modulation means and estimator be implemented jointly in a manner whereby errors made in estimating $\phi_m(t)$ only temporarily affect estimator operation and contribute only incrementally to errors made in estimating $\phi_u(t)$ and demodulating the received signal. This requirement substantially limits the scope of applications for which decision-directed (and data-aided) estimators can be implemented effectively.

SUMMARY OF THE INVENTION

Therefore, one object of the present invention is to provide means for coherently demodulating a received digitally-modulated carrier signal that accommodates an undesired signal-phase component and temporal variations thereof rather than requiring separate estimation of said undesired signal-phase component.

Another object of the invention is to provide means for generating a sequence of estimated values of an undesired signal-phase component for a received digitally-modulated carrier signal.

Another object of the invention is to provide means for coherently demodulating a received digitally-modulated carrier signal comprised of a succession of signal bursts that accommodates an undesired signal-phase component and temporal variations thereof and requires, at most, a few preamble and postamble symbols to be transmitted at the beginning and end of each signal burst, respectively.

Another object of the invention is to provide means for generating a sequence of estimated values of an undesired signal-phase component for a received digitally-modulated carrier signal comprised of a succession of signal bursts of the aforesaid type during the on-time of each signal burst received.

Another object of the invention is to provide means for coherently demodulating multiple received digitally-modulated carrier signals that are each comprised of a succession of non-overlapping signal bursts of the aforesaid type as in TDMA systems.

Another object of the invention is to provide means for generating sequences of estimated values of undesired signal-phase components for multiple received digitally-modulated carrier signals that are each comprised of a succession of non-overlapping signal bursts of the aforesaid type during the on-time of each signal burst received.

These and other objects of the invention are provided by a Composite-Trellis Processor (CTP) system and method which processes a received digitally-modulated carrier signal that has an undesired phase component as appropriate to effect nearly-ideal coherent demodulation and/or generate a sequence of estimated values of said undesired signal-phase component. Demodulation and forward error correction (FEC) decoding are effected jointly for some modulation methods, e.g., for convolutionally encoded m-ary CPFSK.

For applications in which accurate estimates of the undesired signal-phase and modulation interval timing can be provided, a Maximum Likelihood Sequence Estimator (MLSE) can be implemented using prior art which reconstructs the transmitted data sequence with a minimal number of erroneous decisions that result from additive receiver noise (when the noise is white and Gaussian distributed). Such an estimator correlates the received noisy signal with hypothesized signals generated locally for all possible ways that a trellis diagram can be traversed over successive modulation intervals (as a consequence of different sequences of data symbols being transmitted) and determines the optimum path through the trellis diagram, i.e., the path for which the correlation value is largest. Given said optimum path, the sequence of symbols most likely to have been transmitted can easily be determined there from.

The Viterbi maximum likelihood processing algorithm provides a means for implementing a MLSE in an iterative manner, that is, by executing one processing cycle following each modulation interval (or following each of a specified number of contiguous modulation intervals for some applications). The processing operations performed principally generate values for what are often referred to as path metrics (or state metrics) and path histories, one each per to state in a trellis diagram. Each path metric is a cumulative measure of the correlation between the received signal and a locally-generated hypothesized signal that traverses the trellis diagram along a surviving path that terminates at its associated to state. A path history for a surviving path can be represented by a sequence of states traversed by the path, the sequence of modulation symbols that would cause said path to be traversed or both sequences, depending on the specific application. The sequence of modulation symbols for a path can often—but not always, as shown below—be determined from the sequence of states traversed by the path.

A CTP is nominally a MLSE for which the applicable trellis diagram is formed in accord with the teachings of this invention; thus, prior art for implementing MLSEs or relevant variants, augmentations, derivatives or counterparts thereof can be used to implement a CTP. Herein, exemplary embodiments of this invention are described for the case where the Viterbi algorithm and refinements thereof are used to implement CTPs. The embodiment descriptions presented provide an adequate basis for those skilled in the art to implement CTPs using other MLSE implementation means, and such alternative implementations are encompassed by this invention.

For a signal processed in accordance with a CTP system and method, allowed values of signal parameters at a succession of time instants that change as a consequence of the modulation effected are describable abstractly by a trellis diagram designated herein as a root trellis diagram. A root trellis diagram generally consists of equal integer numbers of from states and to states and information descriptive of allowed transitions between from states and to states for each of a succession of modulation intervals in accord with prior art. Depending on the modulation and data encoding means implemented, a state in a root trellis diagram can correspond to a value for a single signal parameter at an instant in time, or a combination of values which collectively characterize multiple signal parameters and the contents of any memory elements that affect from state to to state transitions, e.g., the contents of a data register within a convolutional encoder, at an instant in time. For brevity, that portion of a state's representation which corresponds to a value for the signal's phase is referred to herein as a phase state, with the understanding that a state is often represented completely as a concatenation of a phase state and one or more other partial state representations, e.g., a code state, an amplitude state and so forth. The time instant at which parameter values applicable to a state are valid is often taken to be either just before or just after the beginning of a modulation interval. A transition between from state and to state parameter values can occur near instantaneously, as for modulation phase values when unfiltered m-ary phase shift keying (PSK) is implemented, or throughout the time interval between the time instants at which from state and to state parameter values are valid, e.g., throughout a modulation interval as for m-ary CPFSK signals. This invention applies whenever the parameter value(s) associated with a state in a root trellis diagram explicitly or implicitly includes a value for the modulation phase of the transmitted signal, including a constant modulation phase value, e.g., zero radian, for m-ary ASK, and the phase of the received signal processed includes undesired component $\phi_u(t)$. The number of phase states for a root trellis diagram ranges from one for m-ary ASK to sixty-four or more for m-ary CPFSK when the denominator of the signal's modulation index expressed as an irreducible ratio of integers has a large value.

The allowed transitions between states in a root trellis diagram are determined by the modulation means and, when used, data encoding means implemented. For many designs, each from state may transition to either of p predetermined to states, each to state may be transitioned into from either of p predetermined from states, and each demodulator decision represents $\log_2 p$ bits of received digital data. For each transition in a root trellis diagram, the manner in which each applicable signal parameter varies with time during the modulation interval and a value for the correct demodulator decision are pre-specified (known a priori within a CTP).

A CTP performs processing operations in accord with a composite trellis diagram formed by combining progressively phase-displaced versions of a root trellis diagram and, for some embodiments of this invention, phase migration transitions. Each phase-displaced root trellis diagram in a composite trellis diagram is designated herein as a component trellis diagram, and the phase offset (displacement) for a component trellis diagram can equal any value. When the phase offset for a component trellis diagram equals zero radian, the component trellis diagram is identical to its associated root trellis diagram. The number of phase states in a composite trellis diagram generally equals the number of phase states in its associated root trellis diagram multiplied by the number of component trellis diagrams in the composite trellis diagram. Typically, the signal phase values associated with the phase states in a composite trellis diagram are equally spaced and the signal phase continuum is, thus, uniformly quantized with the phase quantization step size being equal to the phase range spanned by the signal phase values divided by the number of phase states in the composite trellis diagram. Such phase quantization causes a CTP's performance to degrade with respect to the performance of an ideally implemented coherent processor, but the performance degradation can generally be made small by making the number of phase states sufficiently large, i.e., by making the number of component trellis diagrams in the composite trellis diagram sufficiently large. However, the complexity of a CTP is nominally proportional to the number of component trellis diagrams in the composite trellis diagram and said number is normally specified to provide an acceptable compromise between loss in performance due to phase quantization error and implementation complexity.

For some embodiments of this invention, the root trellis diagram has attributes that allow a composite trellis diagram to be comprised of only the root trellis diagram (or, for implementation convenience, a phase-shifted version thereof) and, when applicable, phase migration transitions. That is, the number of component trellis diagrams in a composite trellis diagram can be equal to one. For example, when the modulation method implemented is m-ary CPFSK, the number of phase states in the root trellis diagram can be sufficiently large for the phase quantization step size to be acceptably small without resort to combining two or more component trellis diagrams to achieve that end.

A composite trellis diagram that does not include phase migration transitions can accommodate undesired signal-phase $\phi_u(t)$ to within a phase quantization error when $\phi_u(t)$ equals, or varies only moderately relative to, an arbitrary constant value, e.g. as for signal bursts in TDMA systems that have short durations. Phase migration transitions are typically incorporated into a composite trellis diagram to accommodate both decreases and increases in the value of $\phi_u(t)$ for all distinguishable values thereof. That is, each phase migration transition typically allows a transition in the composite trellis diagram to occur for which the change in signal phase is either smaller or larger than the phase change for an associated transition in a component trellis diagram. Also, phase migration transitions are typically specified to recur periodically over time intervals which each span a specified number of modulation intervals, a phase migration period, and allow migration between phase states in the composite trellis diagrams to occur gracefully over extended intervals of time.

Fortuitously, considerable latitude exists in specifying allowed phase migration transitions. Typically, they are specified so that each to state for a phase migration transition is "phase-adjacent" to a to state for an associated transition in a component trellis diagram so that phase quantization error is minimized. The phase state in the composite trellis diagram for which the signal phase value is largest is considered to be adjacent to the phase state for which the signal phase value is smallest, and phase migration transitions that accommodate signal phase changes between said largest and smallest phase state values are required to accommodate large-scale variations in $\phi_u(t)$. For a given number of phase states in a composite trellis diagram, the maximum rate of change in $\phi_u(t)$ accommodated is greatest when the phase migration period spans only one modulation interval. However, to achieve nearly-ideal bit error probability (BEP) and/or signal phase estimation performances, the phase migration period generally must span sixteen to sixty-four or more modulation intervals depending on the modulation method implemented. Normally, the phase migration period is specified to provide an acceptable compromise between BEP and/or signal phase estimation performances and the rate of change in $\phi_u(t)$ that can be accommodated. Additionally, the phase migration transitions and phase migration period generally must be specified so that the phase migration transitions do not cause Hamming or squared Euclidean distances, whichever applies, for the composite trellis diagram to become unacceptably smaller than corresponding distances for the root trellis diagram.

This invention provides for implementing a CTP either in rigorous accord with a specified composite trellis diagram and associated modulation method or in an expedient manner that provides a preferred tradeoff between processor performance and implementation complexity for many applications. Such alternative methods for processing the received signal are categorized as rigorous processing methods and expedient processing methods, respectively. For either type of processing method, path history values within a CTP implemented using the Viterbi algorithm can be generated either directly or indirectly with the preferred embodiment for a given application being principally determined by implementation complexity—not by processor performance.

For direct path history generation, each path history value represents the sequence of states and/or the sequence of modulation symbols for the surviving path that terminates in the to state for which the path history value is generated. Each demodulator output symbol generated is derived from the "oldest" information stored in a path history value. Often, the number of successive modulation symbols for which path sequence information is stored is referred to as the trellis traceback (or chainback) depth. Its value is specified to be sufficiently large to achieve an acceptable tradeoff between BEP performance and implementation complexity for the signal modulation and FEC coding methods employed.

For indirect path history generation, a "path history" value for a to state often designates either completely or partially the value of the from state for the winning from state to to state transition rather than a sequence of symbols or trellis states. For such indirect path history generation, the actual path history for a to state is determined through the implementation of well known prior-art traceback (chainback) means. Trellis traceback is not required when path histories are generated directly.

For both rigorous processing methods and expedient processing methods, the Viterbi algorithm is implemented identically for to states not allowed to be transitioned into via phase migration transitions during a processing cycle. Herein, to states of said type are designated as no-migration to-states. The most likely of all allowed transitions into each no-migration to-state is determined and corresponding path metric and path history values are updated accordingly for each iteration of the Viterbi algorithm.

For migrate-to to-states, i.e., for to states that may be transitioned into via phase migration transitions for a processing cycle, the processing operations performed to update path metric values depend on whether a rigorous processing method or an expedient processing method is implemented. When the Viterbi algorithm is implemented rigorously, each path metric value for a migrate-to to-state is updated by 1) calculating a candidate path metric value for each allowed transition into the migrate-to to-state, including phase migration transitions, 2) comparing all candidate path metric values for the migrate-to to-state to determine the best path metric value thereof and 3) setting the path metric value for the migrate-to to-state equal to the best path metric value so determined. Path history values for migrate-to to-states are updated in accord with winning trellis transitions, i.e., trellis transitions for which path metric values are best, including winning phase migration transitions, using either direct or indirect path history generation methods as described above.

For a rigorous processing method, the presence of phase migration transitions substantially increases processor complexity since both matched-filter values and branch-metric values appropriate for the phase migration transitions are generated in addition to generating and comparing additional candidate path metric values. The added complexity that derives from the presence of phase migration transitions can be reduced markedly without significantly degrading processor performance for most applications by implementing an expedient processing method. For an expedient processing method, each phase migration transition is specified to connect a migrate-from to-state to a migrate-to to-state and updated path metric and path history values for migrate-to to-states are selected from appropriate provisional path metric and path history values, respectively, calculated as described above for no-migration to states, i.e., as if no phase migration transitions were allowed.

Typically, for an expedient processing method, each phase migration transition connects a migrate-to to-state to a phase-adjacent migrate-from to-state to minimize performance degradation attributable to phase quantization. The phase value for a migrate-from to-state may be either smaller or larger than the phase value for a migrate-to to-state connected thereto. Furthermore, multiple phase migration transitions can concurrently terminate at a migrate-to to-state, e.g. phase migration transitions may concurrently connect both to states that are phase adjacent to a to state to the to state. As for rigorous processing methods, the aggregate of phase migration transitions in a composite trellis diagram generally must accommodate both incremental increases and incremental decreases in the undesired signal-phase value for arbitrary values thereof.

For an expedient processing method and each migrate-to to-state, the path metric value for the migrate-to to-state is updated by first generating provisional path metric values for the migrate-to to-state and all migrate-from to-states connected thereto by phase migration transitions as appropriate for no-migration to-states, i.e., as if there were no phase migration transitions. Then, the path metric value for the migrate-to to-state is updated by setting it equal to the best provisional path metric value so determined. Attendantly, provisional path history values for the applicable to-states are generated and the path history value for the migrate-to to-state is updated by setting it equal to the provisional path history value that corresponds to the best provisional path metric value.

Output signals generated by a CTP include a demodulated data symbol stream and/or successive estimated values of the undesired signal-phase component. Since a distinct hypothesized value of $\phi_u(t)$ is associated with each component trellis diagram, ambiguous estimates of $\phi_u(t)$ can be derived from either directly generated or "tracebacked" path history values that represent successive winning component trellis diagrams. The phase ambiguity is often "np-fold" where $n_p$ equals the number of phase states in a component trellis diagram. An appropriate traceback depth is mechanized for each output signal generated. That is, the traceback depths applicable to data demodulation and undesired signal-phase estimation can have different values— including zero for signal phase estimation. Note also that the traceback depth(s) required to provide near-ideal CTP performance is (are) minimized by deriving output decisions from successive path histories for to states that have the best overall path metric. Deriving output signals from successive path history values for a pre-specified state can result in unacceptable performance since merge distances for a composite trellis diagram can be substantially larger than merge distances for its associated root trellis diagram.

This invention also provides effective means for implementing CTPs which each demodulate and/or estimate the undesired phase of a signal burst or a succession of signal bursts which may originate at one or more transmit terminals, e.g., as in a TDMA system. Specifically, means for initializing and "tailing-off" operation of a CTP that provide for effective processing of burst signals are provided by this invention.

The features and advantages described in the specification are not all-inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE DRAWINGS

The figures depict preferred embodiments of the present invention for purposes of illustration only. One skilled in the art will readily recognize from the following presentation that alternative embodiments of the structures and methods illustrated herein may be employed without departing from the principles of the invention described herein.

Figure 1:
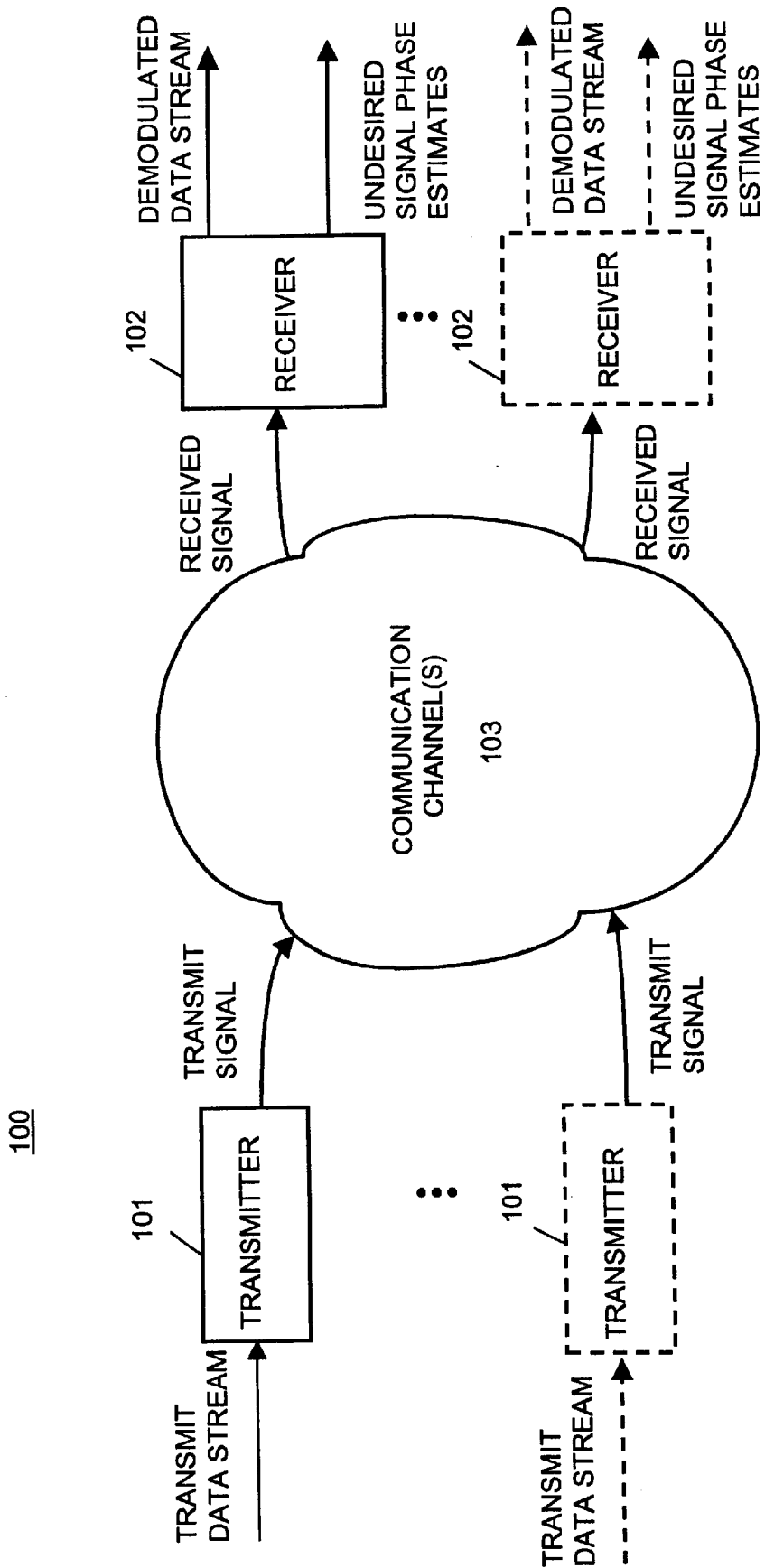
FIG. 1 is a block diagram that illustrates a telecommunication system in accordance with the present invention.

FIG. 1 is a block diagram that illustrates the fundamental elements of a telecommunication system 100 in accordance with the present invention. System 100 includes one or more transmit terminals 101, one or more receive terminals 102 and one or more communication channels 103. The communication channel(s) 103 is (are) comprised of any wireless, wire, optical fiber or electronic means, including one or more passive and/or active (electronic) relay devices, or any combination of such means for propagating each transmit signal from a transmit terminal 101 to one or more receive terminals 102. Any element of the telecommunication system 100 may be either stationary or non-stationary (e.g., moving relative to other elements in the system). Each transmit terminal 101 generates at least one transmit signal using a modulation method appropriate for conveying data in digital form. Each transmit signal is transmitted over at least one communication channel 103 and is received by at least one receive terminal 102. Each transmit signal is expressible by Equation 1 and each signal received by a receive terminal 102 is expressible by Equations 2 and 3. At a receive terminal 102, the desired component of a noisy received signal is nominally of the form of the applicable transmit signal, but its phase is the sum of a desired modulation phase, $\phi_m(t)$, and an undesired signal-phase that normally varies with time, $\phi_u(t)$. Receive terminal 102 includes a Composite-Trellis Processor (CTP) 602 (described in reference to FIG. 6). A CTP 602 processes a received signal in accordance with the present invention to generate a demodulated data stream and/or estimates of undesired signal-phase $\phi_u(t)$.

Embodiments of the present invention for (uncoded) 4-ary, rectangular frequency pulse (1REC), continuous-phase frequency shift keying (CPFSK) are now described. For continuous (non-burst) signaling, the desired component of the received signal is expressible as $$s(t) = A \cdot \sin[\omega_c \cdot t + \phi_m(t) + \phi_u(t)] \quad (4)$$

where signal amplitude A is constant and, during the $n^{th}$ modulation interval, $\phi_m(t)$ varies linearly with time:

$$\phi_m(t) = \quad (5)$$
$$\alpha_n \cdot h\pi \cdot \frac{[t - (n-1) \cdot T_s]}{T_s} + \phi_m[(n-1) \cdot T_s], \ (n-1) \cdot T_s < t \leq n \cdot T_s,$$

where h represents the modulation index, $T_s$ represents the symbol duration and $\alpha_n \in \{-3, -1, +1, +3\}$ for 4-ary signaling. Dibit values $C_n$ determine the values of $\alpha_n$ where, for the so-called direct mapping convention, $C_n \in \{00, 01, 10, 11\}$ in respective set-value order. The values of $C_n$ are typically generated by Gray encoding transmit symbols (dibits) $D_n$ so that the number of erroneous decoded data bits for a given number of demodulated symbol errors is minimized. That is, $D_n$ is typically formed from binary-valued user transmit data sequence $d_1, d_2, d_3, \ldots$ as $D_n = d_{(2n-1)} d_{2n}$ and values thereof are Gray encoded to generate values of $C_n$. For one Gray encoding convention, values of $D_n \in \{00, 01, 11, 10\}$ correspond to values of $C_n$ in respective set-value order. When data are transmitted via a succession of signal bursts as in TDMA systems, a preamble symbol that has a pre-specified value, $C_{pre}$, is transmitted immediately before symbol $C_1$ in each signal burst to provide for effective estimation of $D_1$; similarly, a postamble symbol that has a pre-specified value, $C_{post}$, is transmitted following transmission of the last Gray-encoded transmit symbol in each signal burst to provide for effective estimation of the last corresponding user data symbol conveyed by the burst.

Figure 2A:
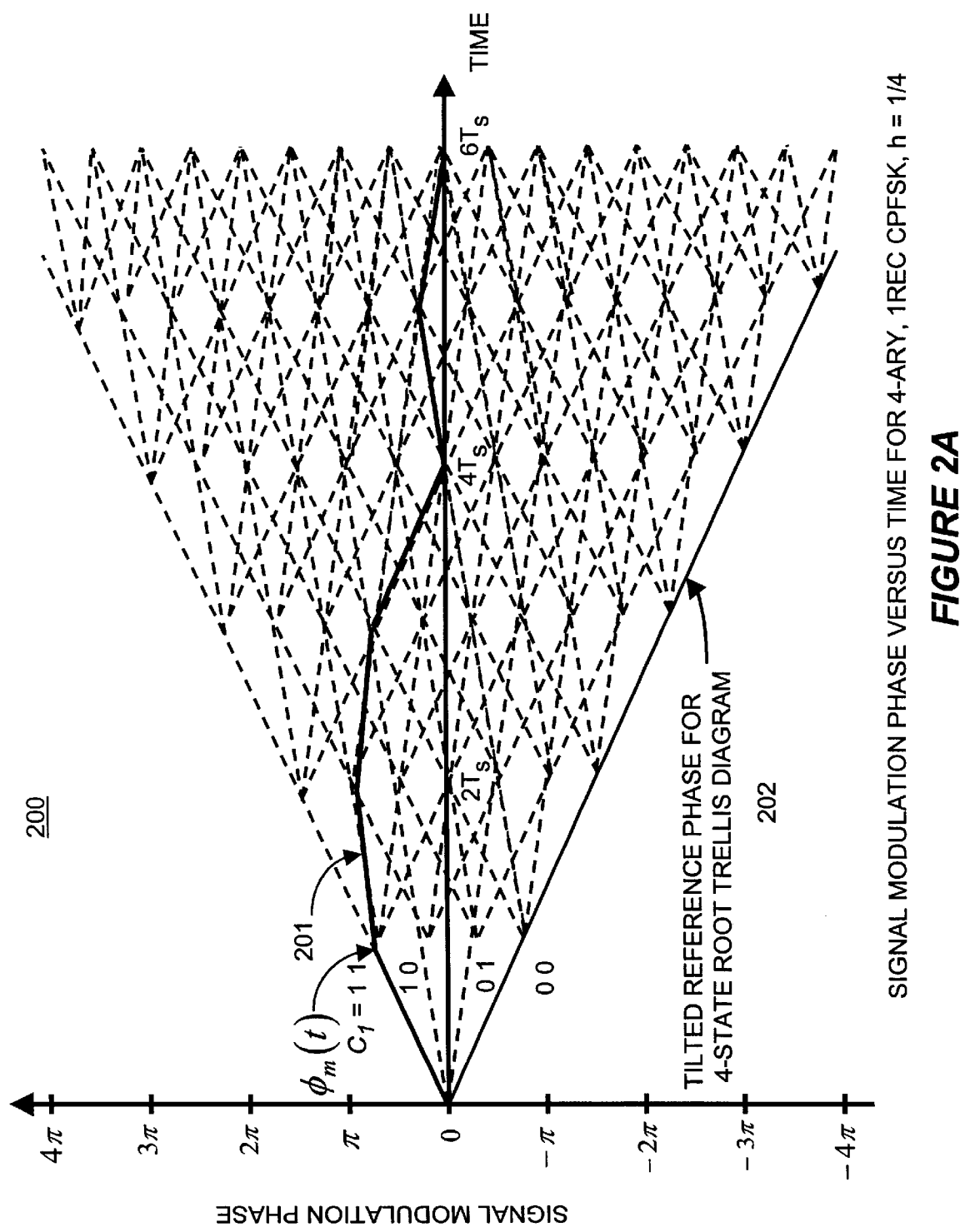
FIG. 2A illustrates transmit signal modulation phase variations versus time for a 4-ary, 1REC CPFSK signal for which the signal modulation index equals one-fourth.
Figure 2B:
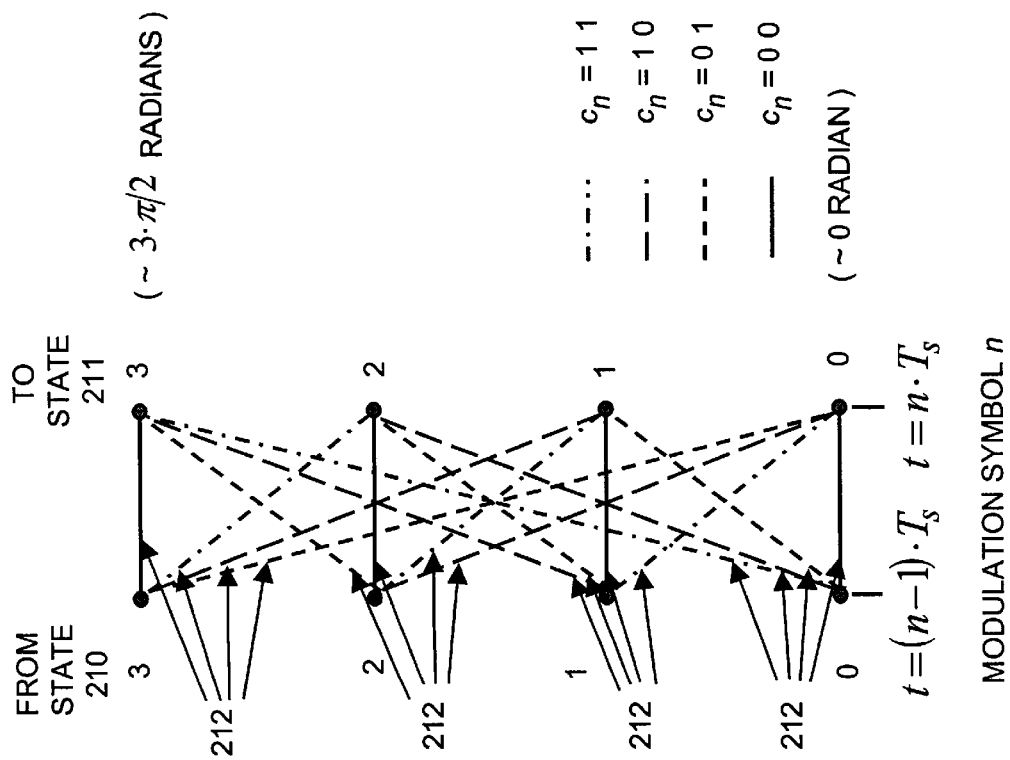
FIG. 2B is a four-state root trellis diagram for the digital phase modulation depicted in FIG. 2A which illustrates state transitions for an arbitrary (single) modulation interval.

FIG. 2A 200 illustrates temporal variations of modulation phase $\phi_m(t)$ 201 in accordance with Equation 5 for 4-ary CPFSK, a modulation index of 1/4 and an example sequence of symbols $C_n$: 11,10,01,00,10,01, . . . . As shown in FIG. 2A, the values of $\phi_m(t)$ at times $n \cdot T_s$ relative to the "tilted" reference phase 202 equal either 0, $\pi/2$, $\pi$, or $3\pi/2$ radians, modulo $2\pi$ radians, for all intege values of n. Thus, for the $n^{th}$ modulation symbol, allowed transitions from relative phase values (states) at time $(n-1) \cdot T_s$ to relative phase values at time $n \cdot T_s$ can be represented abstractly by a four-state root trellis diagram 203 for arbitrary modulation symbol n as shown in FIG. 2B. The root trellis diagram 203 includes four from states 210, four to states 211 and state transitions 212. For the root trellis diagram 203, the relative phase value associated with a state equals the state number multiplied by $\pi/2$ radians.

Figure 2C:
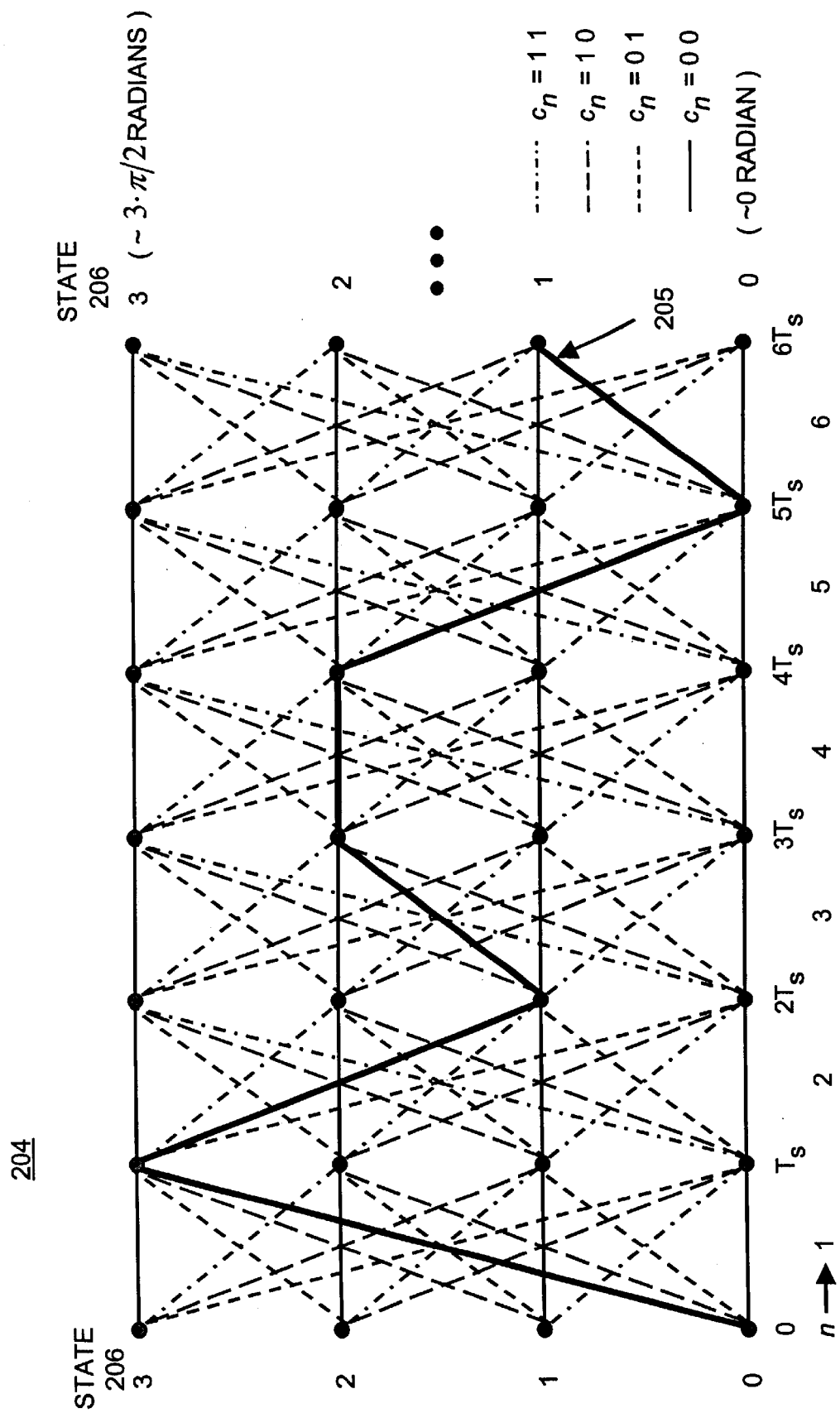
FIG. 2C is a four-state root trellis diagram for the digital phase modulation depicted in FIG. 2A which illustrates state transitions for a succession of modulation intervals.

FIG. 2C shows a root trellis diagram 204 that applies for multiple contiguous modulation intervals. This root trellis diagram 204 is formed by replicating the root trellis diagram 203 shown in FIG. 2B for multiple values of n and depicts a succession of state transitions 205 which correspond to transmit modulation phase $\phi_m(t)$ 201 shown in FIG. 2A.

Figure 3:
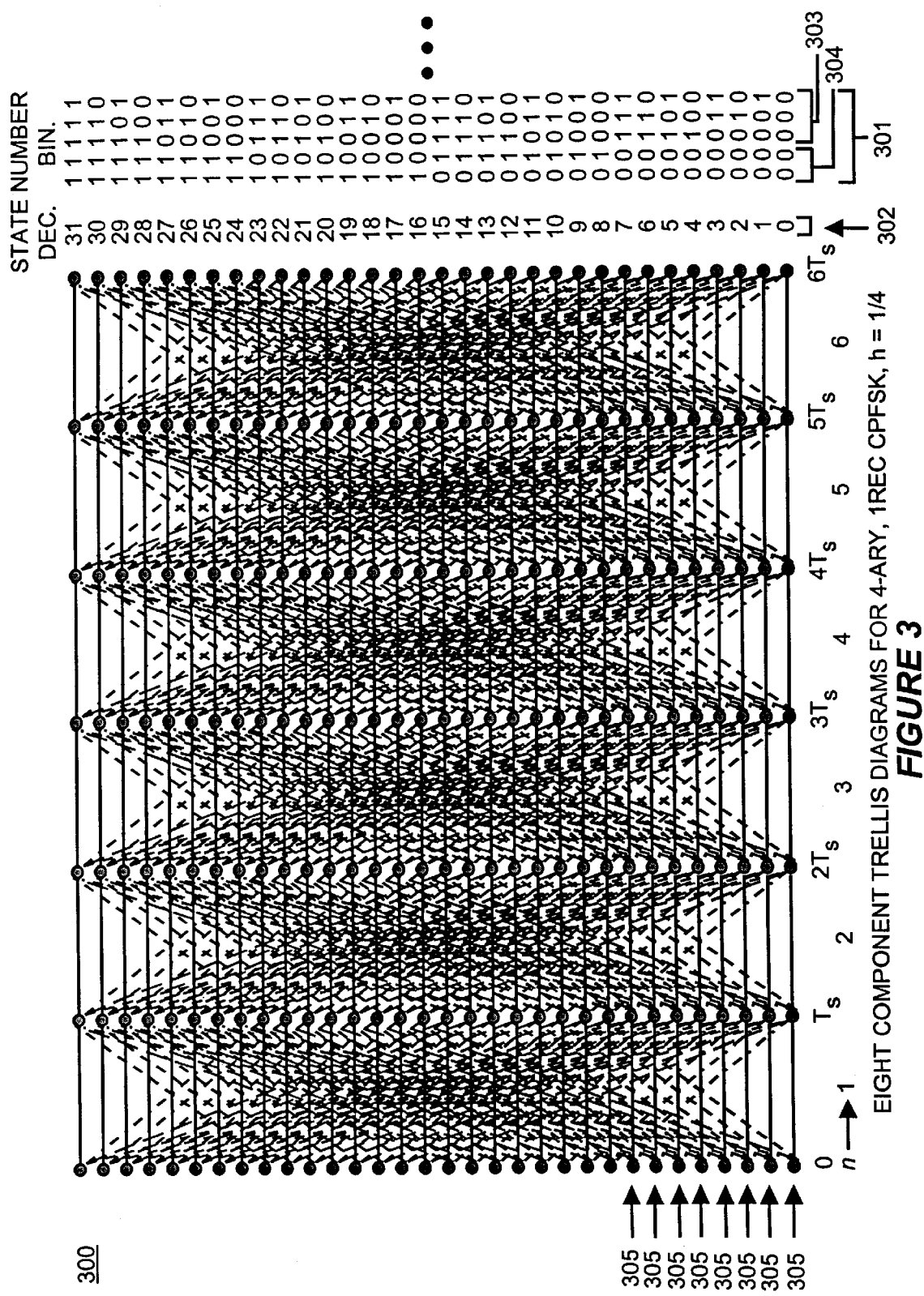
FIG. 3 is a trellis diagram that is a composite of eight four-state component trellis diagrams for a succession of modulation intervals; each component trellis diagram corresponds to a distinct hypothesized value of the undesired component of the received signal's phase and is a phase displaced version of the four-state root trellis diagram illustrated in FIG. 2C.

In accordance with the teaching of the invention, a CTP 602 (described in reference to FIG. 6) processes received signals in accordance with a composite trellis diagram comprised of multiple phase-displaced versions of a root trellis diagram (collectively, component trellis diagrams) and any allowed phase migration transitions. FIG. 3 illustrates a composite trellis diagram 300 including eight 4-ary CPFSK, h=1/4, four-state component trellis diagrams 305 comprising thirty-two phase states 302 numbered 0 through 31 that span a $2\pi$ radians phase range in accordance with one embodiment of the invention. Composite trellis diagram 300 is a no-migration composite trellis diagram meaning that no phase migration transitions are present therein. The signal phase associated with a phase state 302 equals the phase state number multiplied by 2π/32 radian. When five-bit binary numbers 301 are used to characterize the phase states, the three least significant bits of a state number 303 can be interpreted as a component-trellis identification number and the two most significant bits of said state number 304 correspond to the state number 206 of the associated root trellis diagram 204.

One embodiment of a CTP 602 processes in accordance with the no-migration composite trellis diagram 300 illustrated in FIG. 3 using: (i) eight individual four-state Maximum-Likelihood Processors (MLPs) for which path metric values are initialized and normalized using common control signals; (ii) modules for successively determining the best path metric from among the aggregate of thirty-two path metrics generated by the eight four-state MLPs for each modulation interval; and (iii) modules for generating a demodulated data stream from the path history for the state that has the best path metric and/or successive values that designate the sequence of winning four-state MLPs. Each four-state MLP is assigned an identification number equal to the component trellis identification number 303 for its associated four-state component trellis diagram 305, and each four-state MLP is implemented as appropriate for a hypothesized undesired signal-phase value equal to its identification number 303 multiplied by 2π/32 radian. Thus, estimated values of undesired signal-phase $\phi_u(t)$ can be generated by multiplying successive winning four-state MLP identification numbers by 2π/32 radian; such estimates are modulo π/2 radians and, thus, exhibit a four-fold ambiguity.

Since no phase migration transitions are specified for the composite trellis diagram 300 shown in FIG. 3, composite trellis diagram 300 is used primarily in applications for which undesired signal-phase $\phi_u(t)$ remains nearly constant over the interval spanned by the signal demodulated, e.g., as in a symbol-synchronous TDMA system wherein a relatively small number of symbols are transmitted during each signal burst. For such applications, initializing and "tailing-off" operations generally must be performed to provide for effective demodulation of one or a succession of signal bursts. Methods for implementing such operations are described below following descriptions of means for accommodating relatively slowly changing but large-scale variations in undesired signal-phase $\phi_u(t)$.

In accordance with the teaching of this invention, both increases and decreases in the value of $\phi_u(t)$ for all values thereof are accommodated by incorporating phase migration transitions in a no-migration composite trellis diagram 300 in a manner whereby migration between component trellis diagrams 305 can occur. Additionally, the phase migration transitions are specified so that: (i) their presence does not result in path merge distances for the composite trellis diagram being unacceptably smaller than path merge distances for the root trellis diagram; and (ii) the intervals between successive phase migration transitions span sufficient numbers of modulation symbols to result in a bit error probability (BEP) performance acceptably close to the performance of an ideal coherent demodulator.

Figure 4A:
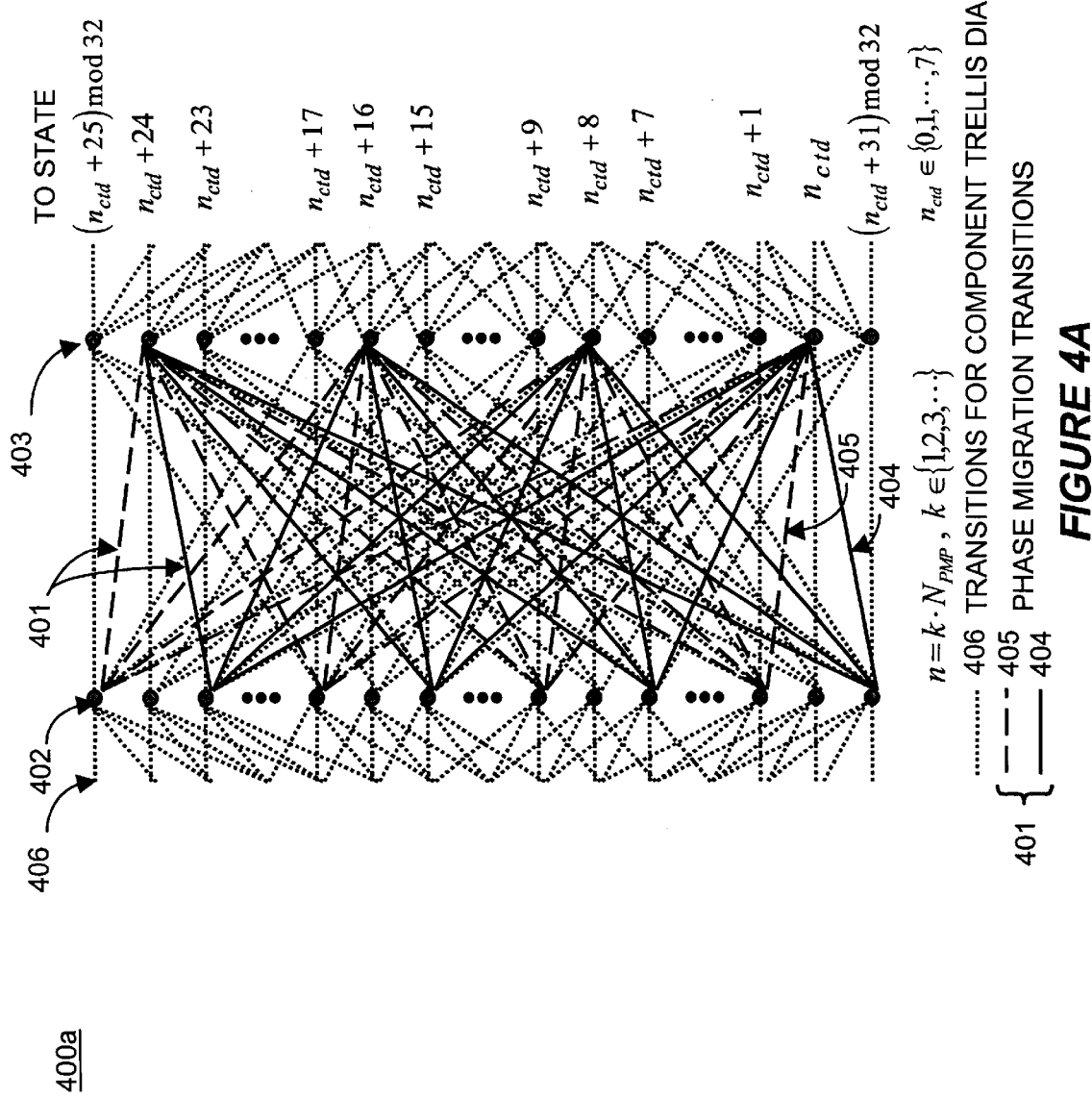
FIG. 4A illustrates one embodiment of phase migration transitions for the trellis diagram shown in FIG. 3 that recur periodically.
Figure 4B:
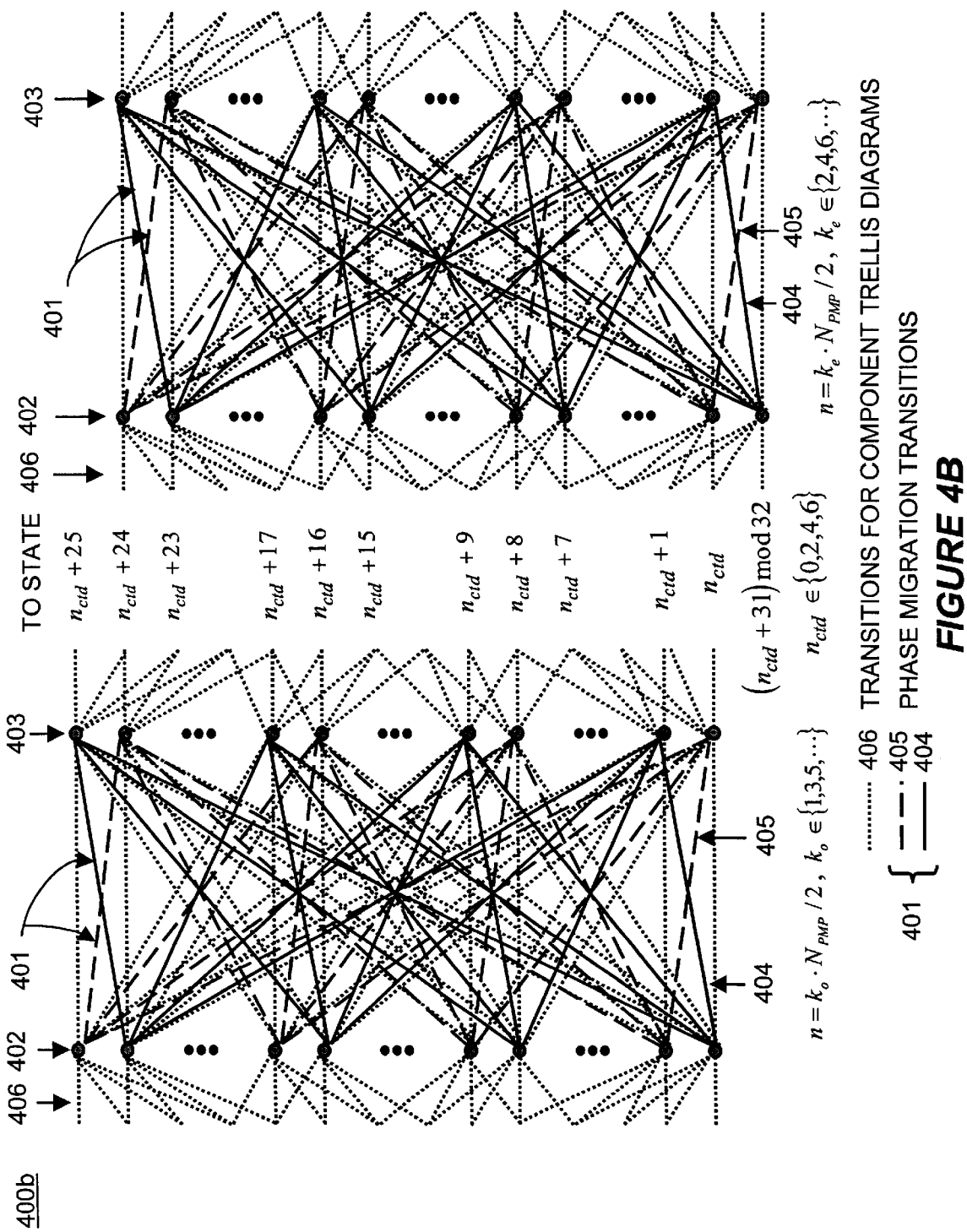
FIG. 4B illustrates a second embodiment of phase migration transitions for the trellis diagram shown in FIG. 3 that recur periodically.
Figure 4C:
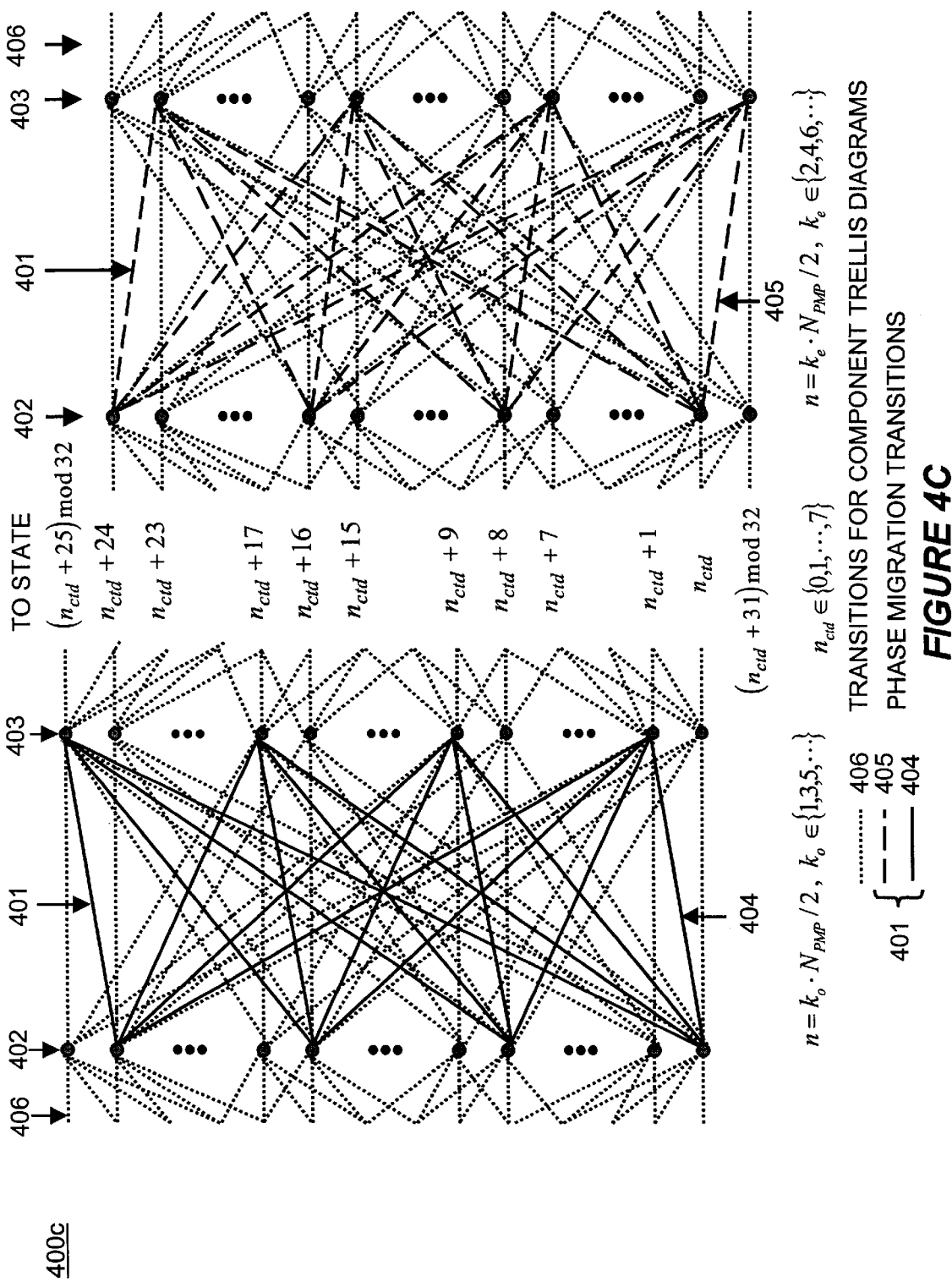
FIG. 4C illustrates a third embodiment of phase migration transitions for the trellis diagram shown in FIG. 3 that recur periodically.

Composite trellis diagrams 400a–400c are shown in FIGS. 4A–4C that include exemplary phase migration transitions 401 in addition to trellis transitions 406 for the eight component trellis diagrams 305 illustrated in FIG. 3. These composite trellis diagrams 400a–400c apply for rigorous processing methods since each phase migration transition 401 therein connects a migrate-from from-state 402 to a migrate-to to-state 403. To avoid depicting an unmanageably large number of trellis transitions in a single diagram, FIGS. 4A–4C each show trellis transitions for a generic component trellis diagram designated by $n_{ctd}$ and component trellis diagrams phase-adjacent thereto. Further simplification is achieved by depicting trellis transitions which comprise the eight component trellis diagrams 305 only for modulation symbol numbers n for which phase migration is allowed. For FIG. 4A, a complete composite trellis diagram is comprised of eight such diagrams—one for each integer value of $n_{ctd}$ in the range from zero through seven—and all trellis transitions within component trellis diagrams 305 for all values of modulation symbol number n. For FIGS. 4B and 4C, $n_{ctd}$ equals even integer values zero, two, four and six and, thus, for FIGS. 4B and 4C, four such diagrams and all trellis transitions within component trellis diagrams 305 for all values of modulation symbol number n comprise a complete composite trellis diagram.

In FIGS. 4A–4C, each phase migration transition 401 connects a migrate-from from-state 402 in a component trellis diagram 305 to a migrate-to to-state 403 in a phase-adjacent component trellis diagram 305 to minimize performance degradation attributable to phase quantization. Herein, two component trellis diagrams 305 are designated as phase-adjacent when the hypothesized undesired signal-phase values associated therewith are adjacent in an ordered list of said hypothesized values for all component trellis diagrams 305. Further, the component trellis diagram 305 for which the hypothesized undesired signal-phase value is largest is considered to be phase-adjacent to the component trellis diagram 305 for which the hypothesized undesired signal-phase value is smallest. The phase state in the no-migration composite trellis diagram 300 for which the signal phase value is largest (modulo the phase-state value range) is considered to be adjacent to the phase state for which the signal phase value is smallest, and phase migration transitions that allow phase migration between said states to occur are required to accommodate large-scale variations in $\phi_u(t)$. Thus, for the example embodiments illustrated in FIGS. 4A through 4C, state 31 is considered to be adjacent to state 0 and phase migration transitions provide phase migration paths both from state 0 to state 31 and from state 31 to state 0.

The phase migration transitions 401 specified in FIGS. 4A through 4C occur periodically over a phase migration period that spans $N_{PMP}$ modulation intervals where $N_{PMP}$ generally ranges from eight to sixteen for 4-ary CPFSK but may be as small as one for FIG. 4A and as small as two for FIGS. 4B and 4C if nearly-ideal coherent processing is not required. FIG. 4A shows permitted phase migration transitions 401 for one embodiment. In this embodiment, the phase migration transitions 401 concurrently accommodate either an increase or a decrease in the value of $\phi_u(t)$ relative to any value thereof provided the phase changes not more than plus or minus 2π/32 radian per $N_{PMP}$ modulation intervals. Thus, the frequency offset accommodated, the frequency-tracking bandwidth, can be made progressively larger by making the value of $N_{PMP}$ progressively smaller. However, nearly-ideal coherent processing is achieved when the value of $N_{PMP}$ is on the order of or greater than eight during normal operation for 4-ary CPFSK.

For selected applications, performance advantages can derive from adaptively controlling the value of $N_{PMP}$. For example, for applications that require initial determination (acquisition) of the received signal's frequency, the value of $N_{PMP}$ can be made smaller than normal while the frequency is being acquired to provide a larger than normal acquisition bandwidth. Also, estimated values of the undesired signal-phase generated by a CTP 602 can be processed to estimate successive values of the frequency error that causes $\phi_u(t)$ to change and these error estimates can be used to correct the local estimate of the received signal's frequency. For example, an estimated value for the cumulative change in the undesired component of the signal's phase over several phase migration periods can be generated for each of a succession of frequency estimation intervals and said values can be divided by the frequency estimation interval duration to form a sequence of residual radian frequency error estimates. In turn, filtered versions of these estimates can be used to control the frequency of a receiver local oscillator signal as appropriate to maintain said frequency error at an acceptably small value.

Referring still to FIG. 4A, from states 402 correspond to the end of the previous modulation interval and to states 403 correspond to the end of the current modulation interval. FIG. 4A shows both transitions 406 for the eight component trellis diagrams 305 and phase migration transitions 401. The phase migration transitions 401 include migrate-up transitions 404 and migrate-down transitions 405. Migrate-up transitions 404 permit phase migration from a component trellis diagram to a phase-adjacent, higher-phase component trellis diagram, i.e., migration to the trellis above. Migrate-down transitions 405 permit phase migration from a component trellis diagram to a phase-adjacent, lower-phase component trellis diagram, i.e., migration to the trellis below. In FIG. 4A, component trellis diagram transitions 406 are represented as dotted lines, migrate-up transitions 404 are represented by solid lines and migrate-down transitions 405 are represented by dashed lines. In summary, the phase migration transitions illustrated in FIG. 4A permit phase migration between component trellis diagrams at times $n=K \cdot N_{PMP}$ for $K \in \{1, 2, 3, \ldots\}$ where phase migration to trellises below via migrate-down transitions 405 and trellises above via migrate-up transitions 404 are permitted concurrently.

Referring now to FIGS. 4B and 4C, one-half of the phase migration transitions 401 allowed during aphase migration period occur at the midpoint of a (any) phase migration period and the remaining phase migration transitions 401 allowed during a phase migration period occur at the end of the phase migration period.

Referring now to FIG. 4B, at the midpoint of each phase migration period that spans $N_{PMP}$ modulation symbols, migrate-down phase migration transitions 405 connect from states 402 in each odd-numbered component trellis diagram to to states 403 in a phase-adjacent, even-numbered component trellis diagram and migrate-up phase migration transitions 404 connect from states 402 in each even-numbered component trellis diagram to to states 403 in a phase-adjacent, odd-numbered component trellis diagram. At the end of each phase migration period, migrate-up phase migration transitions 404 connect from states 402 in each odd-numbered component trellis diagram to to states 403 in a phase-adjacent, even-numbered component trellis diagram and migrate-down phase migration transitions 405 connect from states 402 in each even-numbered component trellis diagram to to states 403 in a phase-adjacent, odd-numbered component trellis diagram.

Referring now to FIG. 4C, at the midpoint of each phase migration period, migrate-up phase migration transitions 404 connect from states 402 in each component trellis diagram to to states 403 in a phase-adjacent, higher-phase component trellis diagram. At the end of each phase migration period, migrate-down phase migration transitions 405 connect from states 402 in each component trellis diagram to to states 403 in a phase-adjacent, lower-phase component trellis diagram.

The system performances for the phase migration transition configurations illustrated in FIGS. 4A through 4C are generally comparable for a given value of $N_{PMP}$. Similarly, many other phase migration transition configurations are effective, and all such configurations are encompassed by this invention. The preferred phase migration transition configuration for a given application will generally depend on second-order performance differences and relative implementation complexities.

Figure 5A:
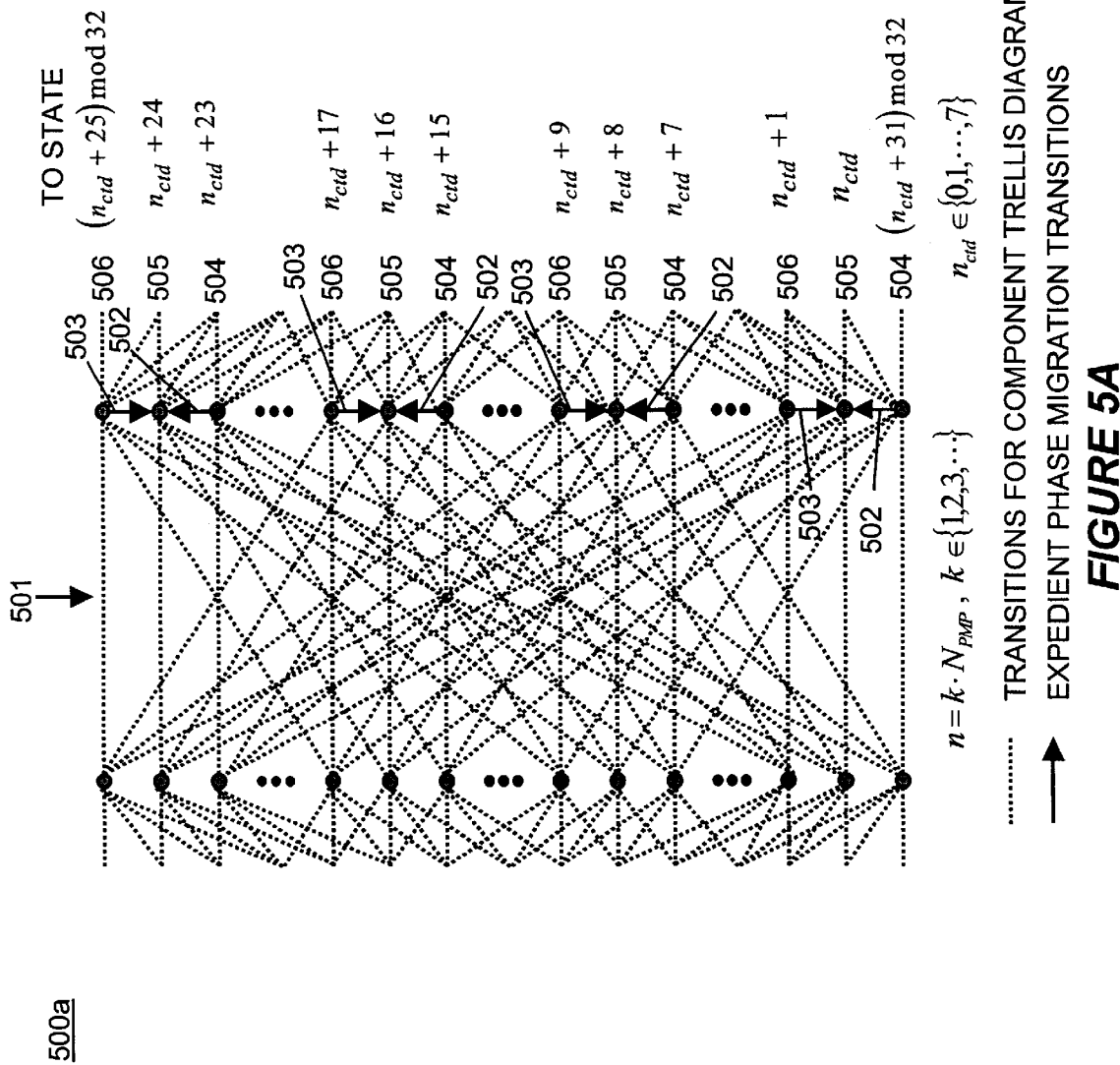
FIG. 5A is a simplified version of FIG. 4A that applies when an expedient processing method is used to generate path metric values.
Figure 5B:
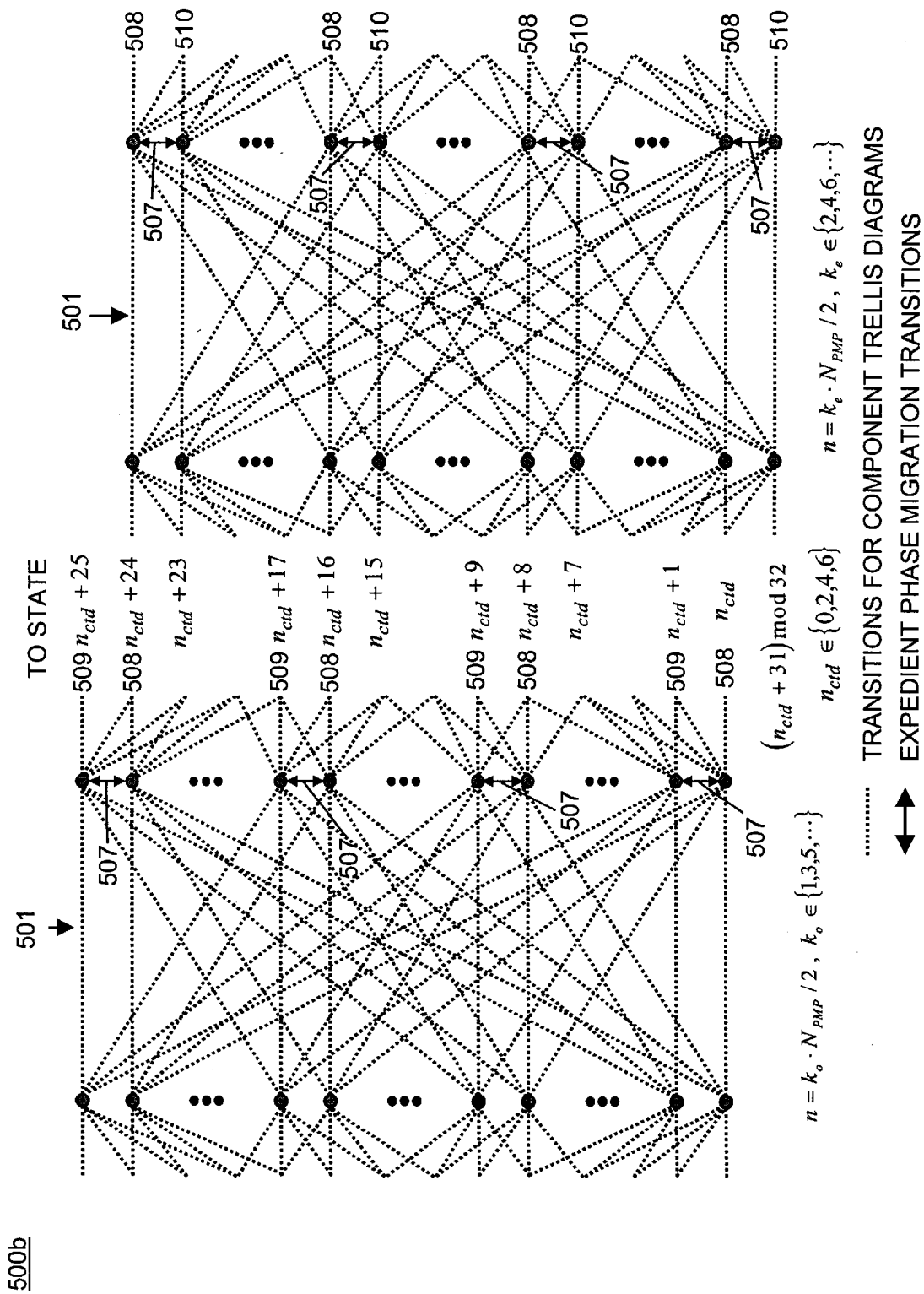
FIG. 5B is a simplified version of FIG. 4B that applies when an expedient processing method is used to generate path metric values.
Figure 5C:
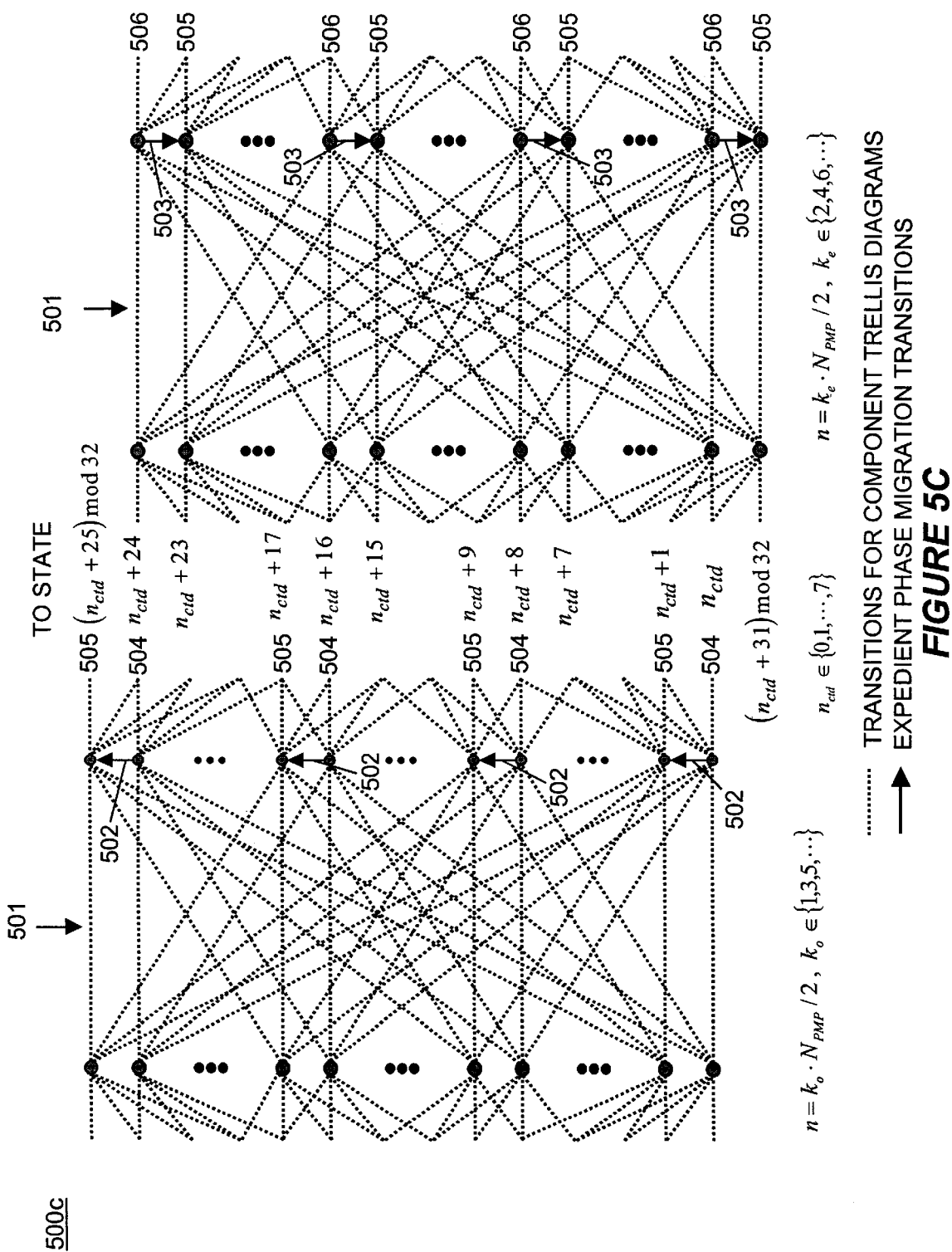
FIG. 5C is a simplified version of FIG. 4C that applies when an expedient processing method is used to generate path metric values.

For expedient processing methods, phase migration transitions each connect a migrate-from to-state to a migrate-to to-state as noted above. Composite trellis diagrams 500a–500c are shown in FIGS. 5A–5C that illustrate exemplary phase migration transitions for expedient processing methods in addition to trellis transitions for the eight component trellis diagrams 305 illustrated in FIG. 3. FIGS. 5A–5C correspond respectively to FIGS. 4A–4C. The methods used to avoid depicting an unmanageably large number of trellis transitions in a single diagram for FIGS. 4A–4C also apply for FIGS. 5A–5C.

In FIG. 5A, trellis transitions 501 for the eight component trellis diagrams 305 are shown as dotted lines (as is also the case for FIGS. 5B and 5C). At the end of each phase migration period that spans $N_{PMP}$ modulation symbols, phase migration transitions 502, 503 concurrently connect migrate-from to-states 504, 506 to migrate-to to-states 505. Phase migration transitions 502 are migrate-up transitions and, thus, accommodate an increase in the undesired signal-phase, whereas phase migration transitions 503 are migrate-down transitions and accommodate a decrease in the undesired signal-phase.

Referring now to FIG. 5B, at the midpoint of each phase migration period spanning $N_{PMP}$ modulation symbols, bi-directional phase migration transitions 507 connect even numbered to-states 508 to phase-adjacent, higher-phase, odd numbered to-states 509. That is, to-states 508 and 509 are each concurrently migrate-from to-states and migrate-to to-states and bi-directional phase migration transitions 507 concurrently accommodate either an increase or a decrease in the undesired signal-phase. Similarly, at the end of each phase migration period, bi-directional phase migration transitions 507 connect even numbered to-states 508 to phase-adjacent, lower-phase, odd numbered to-states 510.

In FIG. 5C, at the midpoint of each phase migration period, migrate-up phase migration transitions 502 connect migrate-from to-states 504 to phase-adjacent, higher-phase migrate-to to-states 505. At the end of each phase migration period, migrate-down phase migration transitions 503 connect migrate-from to-states 506 to phase-adjacent, lower-phase migrate-to to-states 505.

Many other phase migration transition configurations consistent with the teachings herein are effective for expedient processing methods and are encompassed by this invention.

Figure 6:
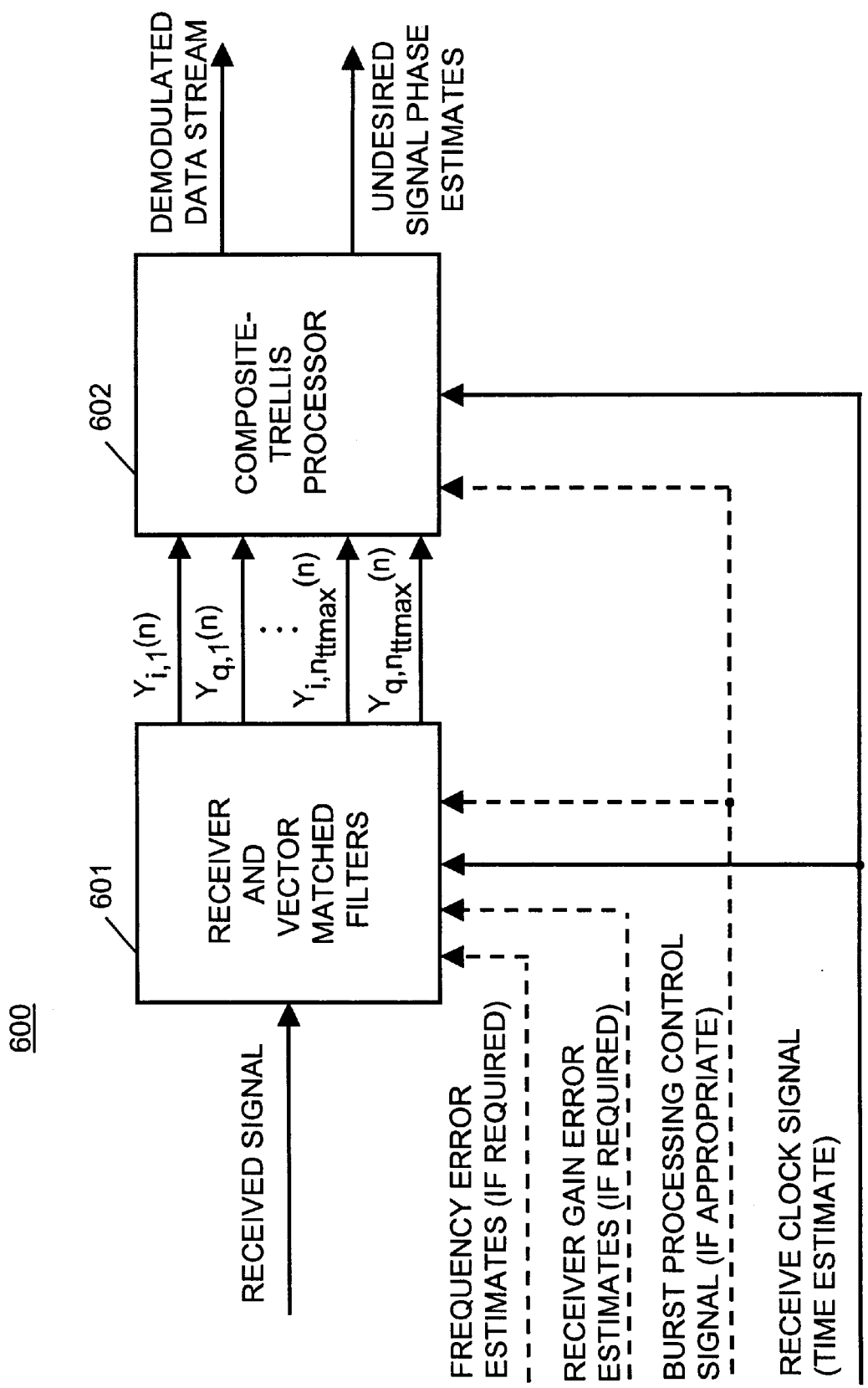
FIG. 6 is a block diagram of a Composite-Trellis Processor System according to one embodiment of the present invention.

A simplified block diagram of a CTP System 600 as used in receive terminal 102 for one embodiment of this invention is illustrated in FIG. 6. CTP System 600 includes Receiver and Vector Matched Filters (RVMF) module 601 and Composite Trellis Processor (CTP) 602. The signals applied to the CTP System 600 include a received signal and a receive clock signal, and optionally include signal frequency error estimates, receiver gain error estimates and/or a burst processing control signal. The receive clock signal provides accurate estimates of the time intervals spanned by the received modulation symbols (receiver time synchronization). As discussed above, the residual received-signal frequency error that derives from imperfect generation of various local oscillator signals, relative motion between transmit and receive terminals and/or motion of any element within the communication channel generally must be maintained suitably small. Frequency error estimates are applied to RVMF module 601 whenever a frequency tracking loop is implemented, and estimates of receiver gain error are applied to the RVMF module 601 whenever externally generated estimates of receiver gain error are used to control receiver gain. The burst processing control signal is provided to the CTP 602 and, for some applications, to RVMF module 601 when signal bursts are processed by the CTP System 600 as in a TDMA system. The value of receive radian carrier frequency $\omega_c$ is established by a signal or signals generated within the RVMF module 601.

Implementation of the Viterbi (maximum likelihood processor) algorithm within a CTP 602 includes the generation of branch metrics expressible as:

$$m_{n_{st},n_{tt}}(n) = c_m \cdot \int_{(n-1)T_s}^{n \cdot T_s} s_{rx}(t) \cdot s_{l,n_{tt}}(n_{st},t) \cdot dt \tag{6}$$

where $c_m$ is a constant when the transmit signal is phase-modulated only, $s_{rx}(t)$ represents the (noisy) received signal (see Equations 2 through 5) and $s_{l,n_{tt}}(n_{st},t)$ represents hypothesized signals generated locally for all trellis transitions applicable for modulation interval n. The to state in the composite trellis diagram 400a–400c, 500a–500c for which processing is effected is represented by $n_{st}$, and $n_{tt}$ is a number that identifies the trellis transition for which the branch metric value applies. Since phase migration transitions 401 (as specified in FIGS. 4A–4C) are generally not allowed for every modulation interval and are not required to be specified as occurring concurrently for all states in the composite trellis diagram 400a–400c, 500a–500c, the range of values for $n_{tt}$ can depend on the values of both n and $n_{st}$. As noted above, branch metric values are not generated for phase migration transitions when an expedient processing method is used to generate path metric values. Thus, for an expedient processing method, the values of trellis transition identifier $n_{tt}$ in Equation 6 can be set equal to corresponding values of hypothesized received symbols.

Signal $s_{l,n_{tt}}(n_{st},t)$ can often be expressed conveniently as a unit amplitude sinusoid:

$$s_{l,n_{tt}}(n_{st},t) = \sin[\omega_c \cdot t + \phi_{l,n_{tt}}(t) + \phi_{lc}(n,n_{st})] \tag{7}$$

where phase terms $\phi_{lc}(n, n_{st})$ are constant-valued over modulation interval n and may or may not vary with n depending on the modulation method employed and how time-dependent phase terms $\phi_{l,n_{tt}}(t)$ are defined. When Equation 7 applies, it can easily be shown using Equations 6 and 7 that $$m_{n_{st},n_{tt}}(n) = Y_{i,n_{tt}}(n) \cdot \cos[\phi_{lc}(n,n_{st})] + Y_{q,n_{tt}}(n) \cdot \sin[\phi_{lc}(n,n_{st})] \tag{8}$$

where $$Y_{i,n_{tt}}(n) \equiv c_m \cdot \int_{(n-1)T_s}^{n \cdot T_s} s_{rx}(t) \cdot \sin[\omega_c \cdot t + \phi_{l,n_{tt}}(t)] \cdot dt \text{ and} \tag{9}$$

$$Y_{q,n_{tt}}(n) \equiv c_m \cdot \int_{(n-1)T_s}^{n \cdot T_s} s_{rx}(t) \cdot \cos[\omega_c \cdot t + \phi_{l,n_{tt}}(t)] \cdot dt. \tag{10}$$

In accord with conventional practice, $Y_{i,n_{tt}}(n)$ and $Y_{q,n_{tt}}(n)$ for a given value of n are interpreted as x (in-phase) and y (quadrature) components, respectively, of a vector defined in a right-hand rectangular coordinate reference frame or, alternatively and equivalently, as the real and imaginary values of a complex number, respectively. By appropriately extending the vector interpretation, Equation 8 can be interpreted as the scalar product of two vectors.

Figure 7A:
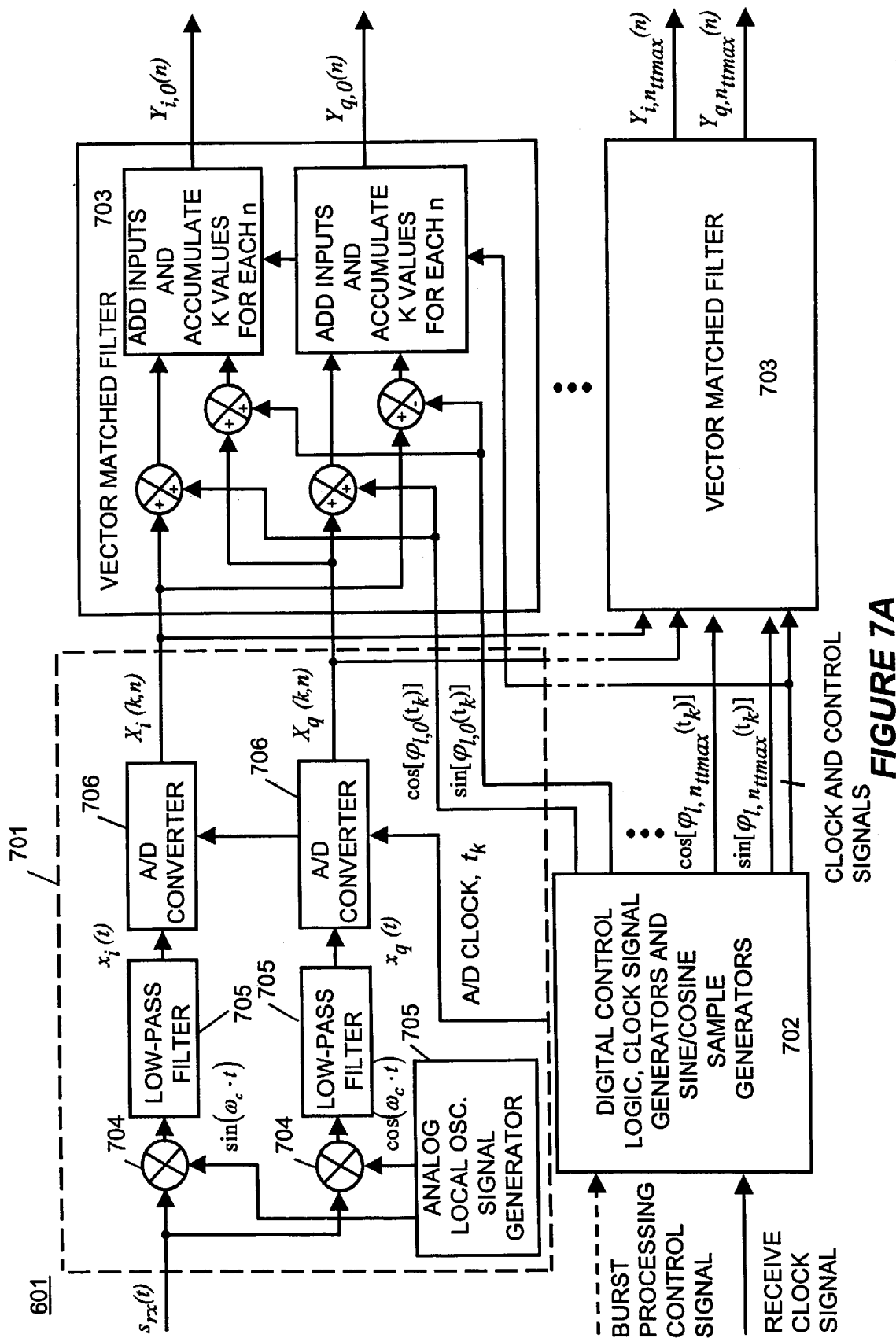
FIG. 7A is a more detailed block diagram of a portion of the Receiver and Vector Matched Filters illustrated in FIG. 6 in accordance with the present invention.

As shown in FIG. 6, the RVMF module 601 generates values for $Y_{i,n_{tt}}(n)$ and $Y_{q,n_{tt}}(n)$. The vector matched filters (such as shown in FIG. 7A) included in RVMF module 601 generates paired values of $Y_{i,n_{tt}}(n)$ and $Y_{q,n_{tt}}(n)$ for a specific value of $n_{tt}$. The vector matched filter portion of RVMF module 601 may operate to directly implement Equations 9 and 10 or, as is typically the case, the receiver portion of the RVMF module 601 amplifies, bandpass filters and translates the frequency of (down-converts) the received signal (one or more times) to generate a lower-frequency (intermediate frequency) counterpart of the received signal. In that event, the vector matched filter portion of RVMF module 601 indirectly implements Equations 9 and 10 by suitably processing a down-converted counterpart of the received signal. When frequency error estimates are applied to the RVMF module 601 attendant frequency error corrections can be effected by either appropriately changing the frequency of a local oscillator signal used to down-convert the received signal or by adding a phase value that changes linearly with time to all signal phases $\phi_{l,n_{tt}}(t)$. Either of several means may also be provided to vary the gain of the receiver in accord with either internally or externally generated receiver gain error estimates.

The RVMF module 601 shown in FIG. 6 can be comprised of analog circuits, digital circuits, digital signal processing (DSP) software (or firmware), or various combinations thereof. For digital implementations, the received signal (or an intermediate frequency version thereof) is converted into a succession of digital values at an appropriate sample conversion rate by an analog to digital (A/D) converter and all other operations required to implement the RVMF module 601 is performed by digital circuits. Alternatively, a baseband counterpart of the received signal comprised of in-phase and quadrature components is generated by analog circuits, said components converted into digital values at an appropriate rate by A/D converters and subsequent processing effected by digital circuits. A block diagram that illustrates the latter approach is illustrated in FIG. 7A.

FIG. 7A is a functional block diagram of an RVMF module 601 in accordance with the invention. RVMF module 601 includes receiver module 701, control module 702 and vector matched filters 703. Receiver module 701 includes analog mixers 704 coupled to local oscillator signal generator 705 and to received signal $s_{rx}(t)$. The outputs of analog mixers 704 are coupled to low pass filters 705. The outputs of lowpass filters 705 are coupled to analog to digital converters 706. Receiver module 701 downconverts and digitizes received signal $s_{rx}(t)$. Control module 702 receives a system clock signal and, optionally, a burst processing control signal and generates signals for controlling the operation of receiver module 701 and vector matched filters 703.

In reference to FIG. 7A, expressions for analog counterparts of digital "signals" $Y_{i,n_{tt}}(n)$ and $Y_{q,n_{tt}}(n)$ are derivable from Equations 9 and 10 through the use of appropriate trigonometric identities (analog and digital versions of these signals are distinguished by the means used to generate them—not by the nomenclature used herein):

$$Y_{i,n_{tt}}(n) = \int_{(n-1)T_s}^{n \cdot T_s} \{x_i(t) \cdot \cos[\phi_{l,n_{tt}}(t)] + x_q(t) \cdot \sin[\phi_{l,n_{tt}}(t)]\} \cdot dt. \tag{11}$$

$$Y_{q,n_{tt}}(n) = \int_{(n-1)T_s}^{n \cdot T_s} \{x_q(t) \cdot \cos[\phi_{l,n_{tt}}(t)] - x_i(t) \cdot \sin[\phi_{l,n_{tt}}(t)]\} \cdot dt. \tag{12}$$

where $$x_i(t) \equiv [c_m \cdot s_{rx}(t) \cdot \sin(\omega_c \cdot t)]_{bb} \text{ and} \quad (13)$$

$$x_q(t) \equiv [c_m \cdot s_{rx}(t) \cdot \cos(\omega_c \cdot t)]_{bb}. \quad (14)$$

In Equations 13 and 14, the notation $[\text{term}]_{bb}$ designates that only the baseband component of term is retained. With reference to FIG. 7A, analog signals $x_i(t)$ and $x_q(t)$ are each sampled K times per modulation symbol interval and converted into sequences of digital (quantized) values by the A/D converters represented by $x_i(k_n)$ and $x_q(k,n)$ respective where $$X_i(k,n) \approx x_i(t_k) \text{ and} \quad (15)$$

$$X_q(k,n) \approx x_q(t_k) \quad (16)$$

for sampling times $t_k$ given by $$t_k = (n-1) \cdot T_s + \left(k - \frac{1}{2}\right) \cdot \frac{T_s}{K}; k \in \{1, 2, \ldots, K\}. \quad (17)$$

The value specified for K is typically in the range from four to sixteen or more depending on the application.

Digital signals $Y_{i,n_{tt}}(n)$ and $Y_{q,n_{tt}}(n)$ (see FIG. 7A) are expressible approximately as $$Y_{i,n_{tt}}(n) \approx \sum_{k=1}^{K} \{X_i(k,n) \cdot \cos[\phi_{l,n_{tt}}(t_k)] + X_q(k,n) \cdot \sin[\phi_{l,n_{tt}}(t_k)]\} \text{ and} \quad (18)$$

$$Y_{q,n_{tt}}(n) \approx \sum_{k=1}^{K} \{X_q(k,n) \cdot \cos[\phi_{l,n_{tt}}(t_k)] - X_i(k,n) \cdot \sin[\phi_{l,n_{tt}}(t_k)]\}. \quad (19)$$

These expressions are inexact because digital circuits generate quantized approximations of sine and cosine values therefor rather than exact values as suggested by the notation used therein.

Application of the foregoing teachings of this invention is now made for 4-ary CPFSK, the trellis structure illustrated in FIG. 5B and an expedient processing method. For this case, trellis transition identifier $n_{tt}$ is assigned values equal to corresponding hypothesized values of modulation symbol $C_n$; that is, $C_n$ is effectively substituted for $n_{tt}$ in applicable equations above. Since the phase values associated with trellis states equal $n_{st} \cdot 2\pi/32$ radian and are measured relative to the tilted phase reference 202 illustrated in FIG. 2A, the phases of the hypothesized received signals generated locally at the end of the $n^{th}$ modulation interval must equal $-n \cdot (3\pi/4) + n_{st} \cdot (2\pi/32)$ radian. The complexity of each vector matched filter 703 is minimized by specifying the phase variables for the hypothesized received signals as $$\phi_{l,0}(t) \equiv \left(1 - \frac{t}{T_s}\right) \cdot \frac{3\pi}{4}, 0 < t \leq T_s \quad (20)$$

$$\phi_{l,0}(t + n_s \cdot T_s) \equiv \phi_{l,0}(t), n_s \in \{1, 2, \ldots\}$$

$$\phi_{l,1}(t) \equiv \left(1 - \frac{t}{T_s}\right) \cdot \frac{\pi}{4}, 0 < t \leq T_s \quad (21)$$

$$\phi_{l,1}(t + n_s \cdot T_s) \equiv \phi_{l,1}(t), n_s \in \{1, 2, \ldots\}$$

$$\phi_{l,2}(t) \equiv -\phi_{l,1}(t), \quad (22)$$

$$\phi_{l,3}(t) \equiv -\phi_{l,0}(t) \text{ and} \quad (23)$$

-continued $$\phi_{lc}(n, n_{st}) \equiv -n \cdot \frac{3\pi}{4} + n_{st} \cdot \frac{2\pi}{32}. \quad (24)$$

Figure 7B:
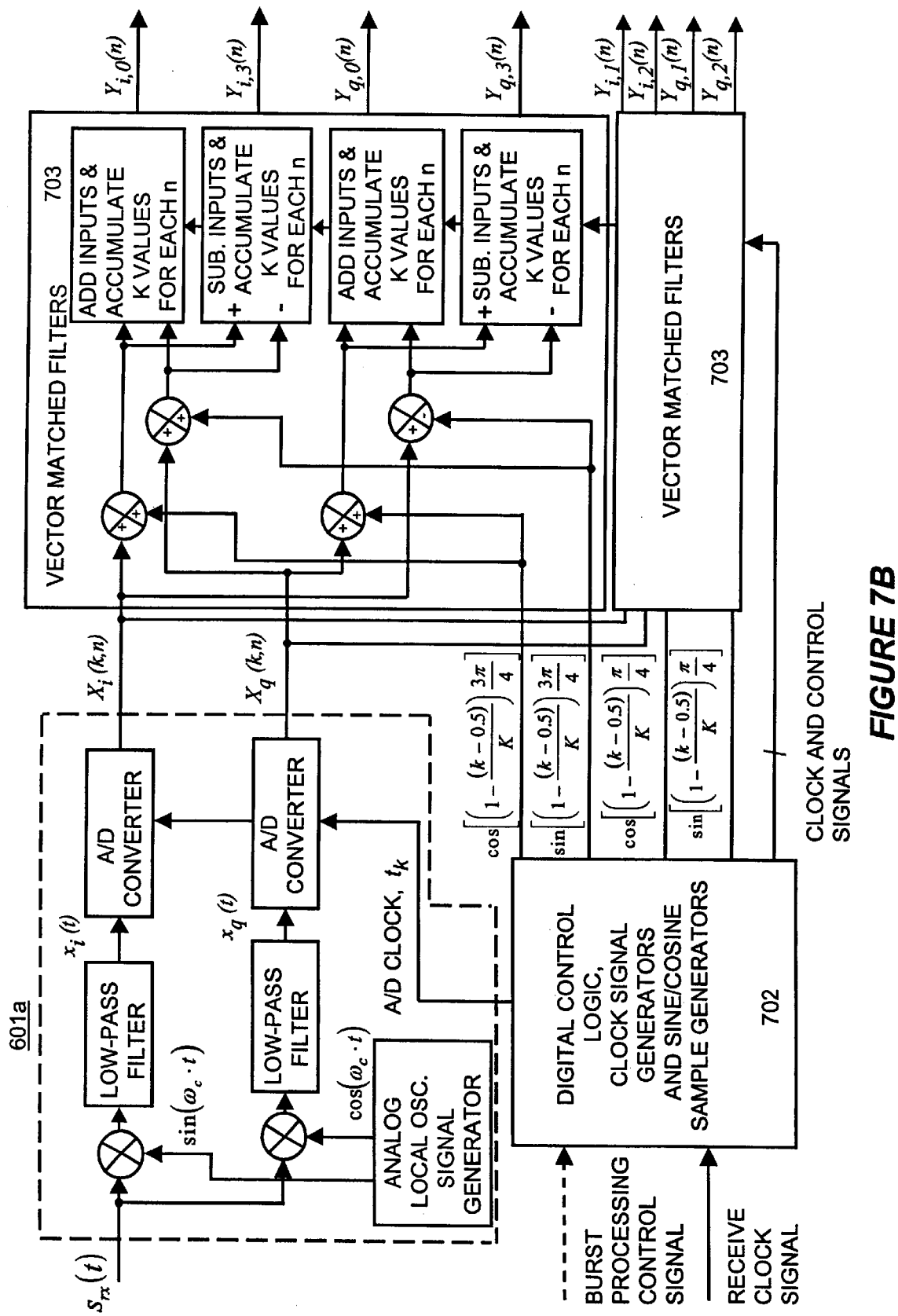
FIG. 7B is a block diagram of a modified version of the Receiver and Vector Matched Filters illustrated in FIG. 7A for one application of the present invention to 4-ary CPFSK.

A block diagram for one embodiment of the RVMF module 601a for this example application is shown in FIG. 7B; this block diagram requires fewer multipliers to implement than does the more general embodiment illustrated in FIG. 7A as a consequence of defining the phase variables so that Equations 22 and 23 apply.

Figure 8:
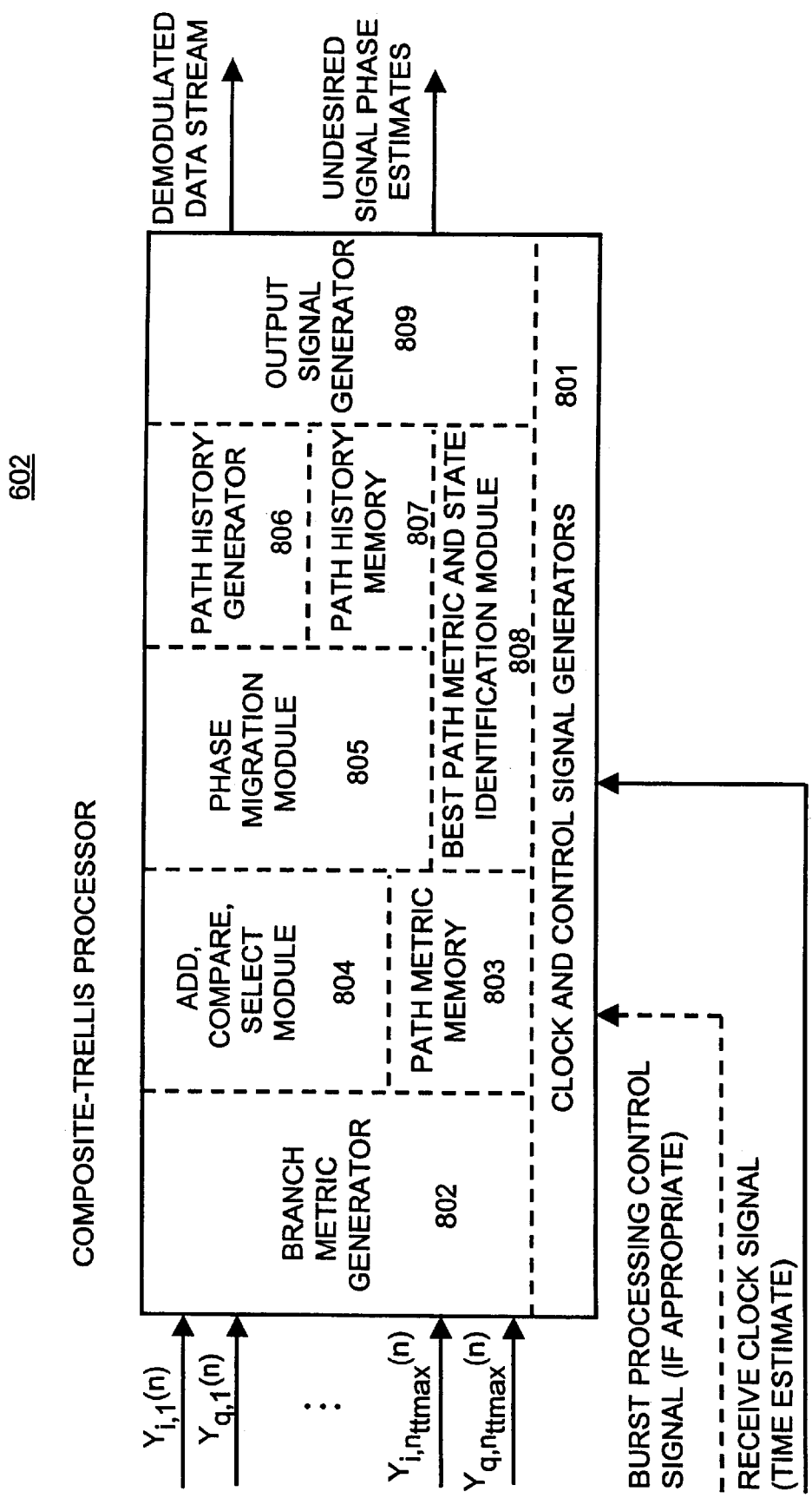
FIG. 8 is a block diagram of a Composite-Trellis Processor for one embodiment of the present invention wherein an expedient processing method is used to generate path metric and associated path history values.

A partitioning of modules by function for one embodiment of the Composite-Trellis Processor (CTP) 602 indicated in FIG. 6 is depicted in FIG. 8. The aggregate of modules implement the Viterbi algorithm and phase migration functions in accord with foregoing teaching of this invention. With reference to FIG. 8, the Clock and Control Signal Generator 801 generates clock signals for and controls processing operations performed by all other modules in the CTP. Digital values of $Y_{i,n_{tt}}(n)$ and $Y_{q,n_{tt}}(n)$ are processed by the Branch Metric Generator 802 for each value of n to generate branch metric values in accordance with Equations 8 and an expression for $\phi_{lc}(n,n_{st})$ that depends on the specific application. Path metric values for each state in the composite trellis diagram 400a–400c, 500a–500c are stored in the Path Metric Memory 803. These values are updated for each value of n by the Add, Compare, Select Module 804 and the Phase Migration Module 805. (Note that phase migration is accommodated intrinsically when path metric values are generated rigorously and the Phase Migration Module 805 depicted in FIG. 8 is not implemented separately for this case.) For each state in the composite trellis diagram 400a–400c, 500a–500c, information directly or indirectly descriptive of winning hypothesized sequence values generated in the process of updating the path metric values is input to the Path History Generator 806. This module generates path history values for each value of n and said values are stored in the Path History Memory 807. The Best Path Metric and State Identification Module 808 determines, for each value of n, the best path metric value and the best state: the state for which the path metric is best. The path history for the best state so determined is processed by the Output Signal Generator 809 to generate the Demodulated Data Stream and/or a sequence of Undesired Signal-Phase Estimates. The best path metric value is typically used to control "normalization" of the path metric values generated by a CTP 602 as appropriate to maintain said values within a range of values accommodated by the design; path metric normalization is typically implemented by subtracting a common value from all path metric values generated during an iteration of the processing algorithm whenever the best path metric value exceeds a prespecified value.

To this point, the best path metric value has been equated to the largest path metric value. However, for many practical implementations of the Viterbi algorithm, signed digital values for branch metrics are generated and then transformed into unsigned digital values for which small values are "best", and "worst" values,may be compressed or otherwise restricted to a range convenient for implementation without significantly compromising performance. Such alternative means apply for this invention.

Figure 9:
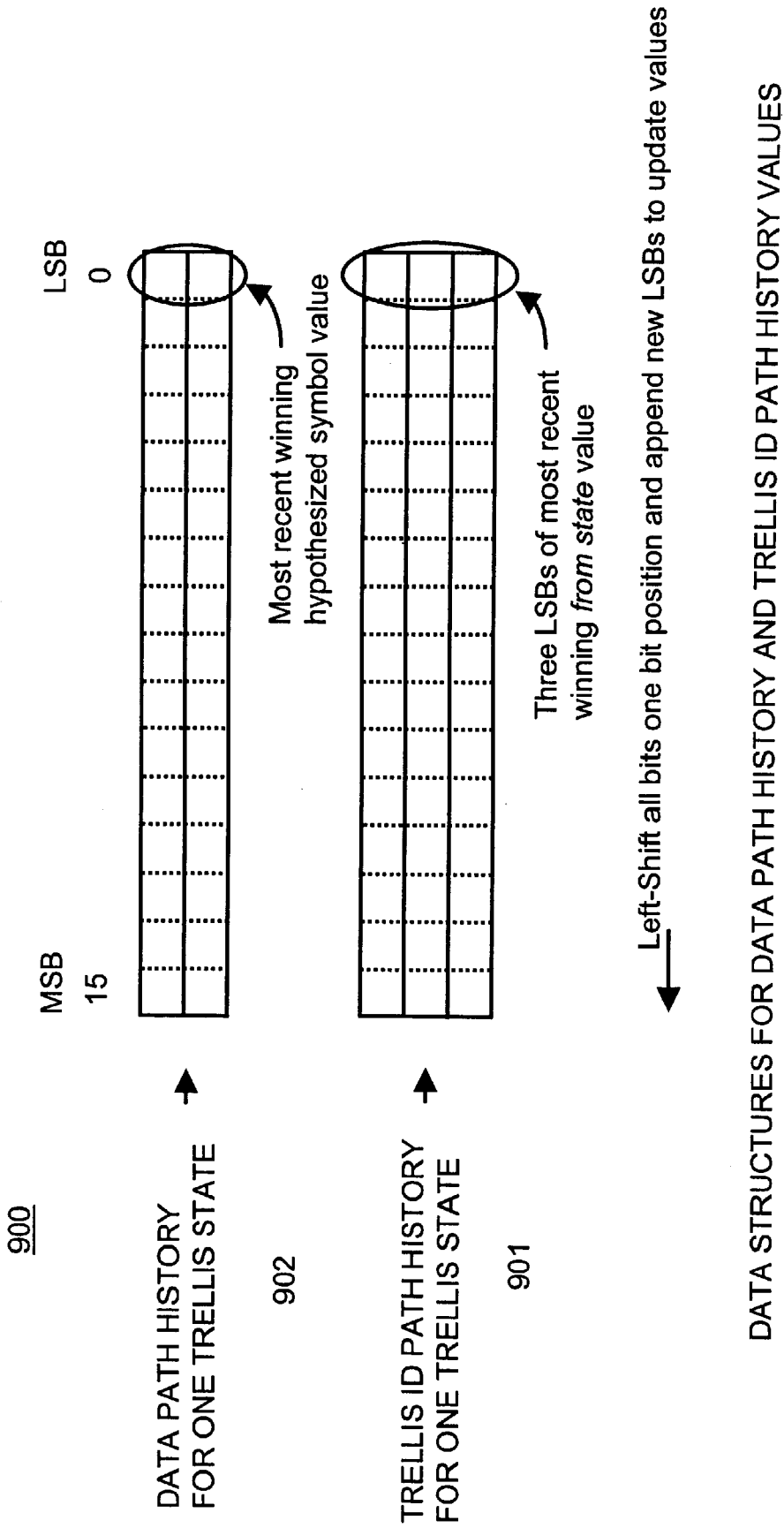
FIG. 9 depicts data structures for data path history and trellis id path history values for one embodiment of the present invention applicable to 4-ary CPFSK.

A more detailed description of the operations described in preceding paragraphs is now given for the 4-ary CPFSK example used to illustrate the teachings of this invention. In the interest of specificity, the path history values are considered to be generated explicitly. Both data sequence and trellis identification sequence path history values are generated for each state in the composite trellis diagram 400a–400c, 500a–500c from which the Demodulated Data Stream and a sequence of Undesired Signal-Phase Estimates are generated, respectively. Specifically, for each said trellis state, a data (sequence) path history 902 (as shown in FIG. 9) is represented by sixteen two-bit digital numbers and a trellis id(entification) (sequence) path history 901 (as shown in FIG. 9) is represented by sixteen three-bit digital numbers. A data path history 902 value for a trellis state specifies the sequence of modulation-symbol dibit values for the surviving path that terminates at the trellis state which spans the most recent sixteen iterations of the algorithm. Similarly, the sixteen three-bit numbers that comprise a trellis id path history 901 (aggregate) value, specify the three least significant bits (LSBs) 303 of five-bit state numbers 301 for the sixteen most recent trellis states traversed by the surviving path. (As noted previously, the signal phase modulo $\pi/2$ radians associated with a trellis state is equal to the three LSBs of the trellis state's number 303 multiplied by $2\pi/32$ radian.) Note that, for this illustration, the traceback depth equals sixteen for both data demodulation and undesired signal-phase estimation; a data demodulation traceback depth of eight will provide acceptable performance for some applications, and an undesired signal-phase estimation traceback depth of eight or less may be preferred to reduce processing delay for phase estimation and implementation complexity. Further, the appropriate value for the data demodulation traceback depth may be significantly larger than sixteen for applications in which demodulation and FEC decoding are performed jointly, e.g., as when convolutionally encoded CPFSK signals are processed.

For convenience of implementation, the data path history 902 and trellis id path history 901 values for a trellis state are jointly represented as five sixteen-bit numbers 900 as depicted in FIG. 9. For the embodiment illustrated therein, the most significant bits (MSBs) of said five sixteen-bit numbers represent the "oldest" path history information and the LSBs of these numbers represent the most recently determined path history values. The values of the five numbers are updated by multiplying each of them by two— by shifting all bits that comprise the five numbers left by one bit position and discarding the five MSBs—and appending an appropriate LSB to each of the five numbers. A 160 word, sixteen bit per word random access memory (RAM) could be used to store the path history values for all thirty-two states in the composite trellis diagram 400a–400c, 500a–500c.

For the subject embodiment, values of $Y_{i,0}(n)$, $Y_{q,0}(n)$, ..., $Y_{i,3}(n)$ and $Y_{q,3}(n)$ are processed by the Branch Metric Generator 802 depicted in FIG. 8 for each value of n to generate branch metric values in accordance with Equations 8 and 24. For expedient path metric processing, candidate path metric values for received symbol n are calculated for each state in the composite trellis diagram 500a–500c using the expression $$CM_{n_{st},C_n}(n)=M_{n_{fmst}}(n-1)+m_{n_{st},C_n}(n) \quad (25)$$

where $M_{n_{fmst}}(n)$ represents the path metric value for state $n_{fmst}$ following completion of processing for received symbol n, and $n_{fmst}$ represents the from state for the hypothesized trellis transition. (Note that the values of $M_{n_{st}}(n)$ for all thirty-two values of $n_{st}$ are set equal to zero before normal operation is initiated.) For the present example embodiment, $n_{fmst}$ is given by $$n_{fmst}=(n_{st}-8\cdot C_n+32) \bmod 32; \ C_n \in \{0,1,2,3\}. \quad (26)$$

Thus, the candidate path metrics are expressible as $$CM_{n_{st},0}(n)=M_{n_{st}}(n-1)+m_{n_{st},0}(n), \quad (27)$$

$$CM_{n_{st},1}(n)=M_{(n_{st}+24)\bmod 32}(n-1)+m_{n_{st},1}(n), \quad (28)$$

$$CM_{n_{st},2}(n)=M_{(n_{st}+16)\bmod 32}(n-1)+m_{n_{st},2}(n), \text{ and} \quad (29)$$

$$CM_{n_{st},3}(n)=M_{(n_{st}+8)\bmod 32}(n-1)+m_{n_{st},3}(n), \quad (30)$$

for hypothesized received symbol values $C_n$ of 0 through 3 respectively. For each state in the composite trellis diagram 500a–500c, four candidate path metric values are generated in accord with Equations 27 through 30, these values are compared to determine the largest value thereof, and the value of a provisional path metric $PM_{n_{st}}(n)$ is set equal to the largest candidate path metric value so determined. Concurrently, a provisional data path history 902 value and a provisional trellis id path history 901 value are generated for each state in the normal manner. Specifically, values of hypothesized received symbol $C_n$ and $n_{fmst}$ for which the candidate path metric value is largest are determined, the "old" data path history 902 value for said value of $n_{fmst}$ is read from memory, left-shifted by one bit position and said value of $C_n$ appended thereto as LSBs (see FIG. 9) to generate a provisional data path history value. Similarly, the "old" trellis id path history 901 value for said value of $n_{fmst}$ is read from memory, left-shifted by one bit position and the three LSBs of the state number appended thereto as LSBs (see FIG. 9) to generate a provisional trellis id path history value.

When composite trellis diagram 500b shown in FIG. 5B is implemented, for example, phase migration transitions are allowed to occur when and only when n equals an integral multiple of $N_{PMP}/2$. For all other values of n, $M_{n_{st}}(n)$ is always set equal to $PM_{n_{st}}(n)$ and new data path history 902 and trellis id path history 901 values are set equal to corresponding provisional values for every value of $n_{st}$. For each value of n that equals an odd multiple of $N_{PMP}/2$, phase migration is allowed between each even-numbered state $n_{st}$ and an associated odd-numbered state $(n_{st}+1)$ (see FIG. 5B). For this case, and for each even-numbered state, the values of $PM_{n_{st}}(n)$ and $PM_{(n_{st}+1)}(n)$ are compared to determine which value is largest. When the value of $PM_{n_{st}}(n)$ is greater than or equal to the value of $PM_{(n_{st}+1)}(n)$, the values of $M_{n_{st}}(n)$ and $M_{(n_{st}+1)}(n)$ are both set equal to the value of $PM_{n_{st}}(n)$ and the data path history 902 and trellis id path history 901 values for states $n_{st}$ and $(n_{st}+1)$ are both set equal to corresponding provisional path history values for state $n_{st}$. Otherwise, i.e., when the value of $PM_{n_{st}}(n)$ is less than the value of $PM_{(n_{st}+1)}(n)$, the values of $M_{n_{st}}(n)$ and $M_{(n_{st}+1)}(n)$ are both set equal to the value of $PM_{(n_{st}+1)}(n)$ and the data path history 902 and trellis id path history 901 values for states $n_{st}$ and $(n_{st}+1)$ are both set equal to corresponding provisional path history values for state $(n_{st}+1)$. Similarly, when n equals an even multiple of $N_{PMP}/2$ phase migration is allowed between each even-numbered state $n_{st}$ and an associated odd-numbered state, $[(n_{st}+31) \bmod 32]((n_{st}-1)$ except for $n_{st}$ equal to zero), and the preceding description of operation for n equal to an odd multiple of $N_{PMP}/2$ is made applicable by substituting $[(n_{st}+31) \bmod 32]$ for $(n_{st}+1)$. The appropriate value for $N_{PMP}$ generally ranges from about four to thirty-two or more depending on the application.

For the subject example application, generation of the Demodulated Data Stream and a sequence of Undesired Signal-Phase Estimates is initiated after processing has been completed for sixteen received modulation symbols. At that time, the value of $n_{st}$ for which the thirty-two values of $M_{n_{st}}(n)$ is largest, $n_{st\ out}$, is determined. In turn, the oldest hypothesized dibit value stored in the data path history 902 word for state $n_{st\ out}$ is read from memory, Gray decoded, and the Gray decoded dibit "output" as two successive data bits in the Demodulated Data Stream. Correspondingly, the oldest three-bit value stored in the trellis id path history 901 words for state $n_{st\ out}$ is read from memory and output as the first Undesired Signal-Phase Estimate. Subsequently, for each successive value of n, a new value for $n_{st\ out}$ is determined, the oldest path history values for the new value of $n_{st\ out}$ are read from memory, and output signals Demodulated Data Stream and Undesired Signal-Phase Estimates are generated there from.

When the received signal processed by a CTP 602 is comprised of a signal burst or a succession of signal bursts which may originate at one or more transmit terminals, e.g., as in a TDMA system, means for initializing and "tailing-off" CTP operation can be implemented whereby data symbols near the beginnings and ends of signal bursts are processed effectively. For m-ary PSK applications, data symbols are typically differentially encoded prior to transmission and demodulated data symbols are differentially decoded to accommodate an m-fold ambiguity in estimating the undesired component of the received signal's phase at the receiver. A (one) differential decoding reference symbol is typically transmitted at the beginning of each signal burst when differential encoding and decoding are implemented whereby the first decoded output symbol for each burst is generated properly within the receiver; typically, no other burst preamble and postamble symbols are required to be transmitted for PSK modulation methods. When CPFSK is used to convey data, the transmission of a differential decoding reference symbol at the beginning of each signal burst is not required. However, since the merge distances for CPFSK modulations are equal to or greater than two, achievement of a bit error probability (BEP) for bits transmitted at the beginnings and ends of signal bursts comparable to the BEP for mid-burst bits generally requires the transmission of at least one preamble symbol and one postamble symbol in each signal burst. The numbers of preamble and postamble symbols transmitted in a (any) signal burst are each nominally equal to the minimum merge distance for the CPFSK modulation method implemented minus one. Additional postamble symbols are transmitted in each CPFSK signal bursts when transmitted data bits (or symbols) are convolutionally encoded as appropriate to implement forward error correction (FEC), as discussed subsequently.

When preamble and/or postamble symbols are present in a received signal burst processed by a CTP, best BEP performance is generally achieved by assigning specific values to specified numbers of preamble and postamble symbols and implementing the Viterbi algorithm so that the winning hypothesized symbol values equal corresponding a priori specified symbol values when preamble and postamble symbols are processed. For example, if a preamble symbol is pre-specified to have a value of "0" then the CTP is implemented so that, for each state in the trellis diagram, the updated path metric value is forced to equal the candidate path metric value for a hypothesized received symbol value of "0" when the preamble symbol is processed. The burst processing control signal indicated in FIG. 6 is generated so that the time intervals spanned by the preamble, data and postamble symbols can be determined there from. Typically, for each signal burst processed by the CTP 602, transitions in the level of the burst processing control signal occur at the beginning of the first symbol in the burst and at the end of the last data symbol in the burst. For example, the burst processing control signal can have a high level during time intervals spanned by preamble and data symbols processed and a low level otherwise.

When CPFSK and convolutional FEC coding are implemented jointly and signal bursts are transmitted, the state of the FEC encoder is normally set to a pre-specified value—typically "0"—at the beginning of each signal burst. For each signal burst, after the last "user" (information) data bit or symbol conveyed by the burst has been clocked into the FEC encoder shift register (or registers) "flush" bits or symbols that have pre-specified values, e.g., "0s", are successively clocked into the FEC encoder's shift register(s) as if they were user data bits or symbols and the symbols generated by the FEC encoder are transmitted as FEC postamble symbols. The generation of FEC postamble symbols is terminated when the last user data bit or symbol clocked into the FEC encoder can no longer affect the value of an FEC postamble symbol. At the end of each signal burst, one or more additional postamble symbols may be transmitted after the last FEC postamble symbol is transmitted as described above.

For CTPs 602 that jointly demodulate and FEC-decode burst signals, best BEP performance at the beginnings of signal bursts is achieved by initializing the path metric values or otherwise implementing the processor so that the winning from state values for the first iteration of the algorithm are consistent with the a priori known initial state of the FEC encoder (and a priori known preamble symbol value or values when one or more preamble symbols are transmitted). When the last user data bit or symbol transmitted in a signal burst is clocked into the FEC encoder the encoder state has an arbitrary value. For each flush bit or symbol subsequently clocked into the FEC encoder, the number of code states that can be traversed by a transmit trellis path is successively reduced until the code state is known precisely. Best BEP performance at the ends of signal bursts is achieved by implementing the CTP 602 so that only paths through the demodulator trellis that correspond to allowed paths through the transmit trellis are permitted to survive when postamble symbols are processed. (Of course, the ending value of the undesired signal-phase is not known a priori at the receiver location and, thus, the phase state portions of state identification numbers have arbitrary values.) Complete utilization of the a priori information regarding allowed trellis transitions at the ends of bursts within the CTP can result in the BEP for bits at and near the ends of bursts being smaller than the BEP for mid-burst bits.

When signal bursts are processed by a CTP 602, each burst terminates before demodulated values for all data bits conveyed by the burst have been generated and output by the CTP 602. After processing for the last symbol in a signal burst is completed, the trellis state (among the trellis states allowed to be traversed at the end of the burst) for which the path metric value is largest, the last winning state, is determined. Subsequently, demodulated data bits are generated from the path history value for the last winning state. If a capability for processing a succession of closely spaced signal bursts is required, additional means for storing path history information at the end of a burst may need to be provided so that "old" path history information is not overwritten with path history information generated for the new signal burst before the last demodulated data bits are generated for the preceding signal burst. For example, if the direct method is used to generate path history values, the path history (aggregate) value for the last winning state can be transferred to a shift register (or registers) and output signals generated after a burst terminates by appropriately shifting the register contents. Similarly, if the indirect method is used to generate path history values, the sequence of states traced back through after the last winning state for a burst is determined can be stored in a register (or registers) and the stored values can be suitably selected to generate output signals following the end of a burst.

As noted above, for certain embodiments of this invention a composite trellis diagram may be comprised of exactly one component trellis diagram, the root trellis diagram or a phase displaced version thereof, and, when applicable, phase migration transitions. For example, for 4-ary, 1REC CPFSK and a modulation index value of 9/32 referred to hereinafter as the 4-ary CPFSK, h=9/32 case, the minimum number of phase states in the root trellis diagram equals 32, as is well known from prior art. Assuming that 32 phase states provides a preferred tradeoff between performance degradation due to phase quantization error and implementation complexity, a 32-state composite trellis diagram for this case can be comprised of exactly one component trellis diagram and, when applicable, phase migration transitions.

Figure 13:
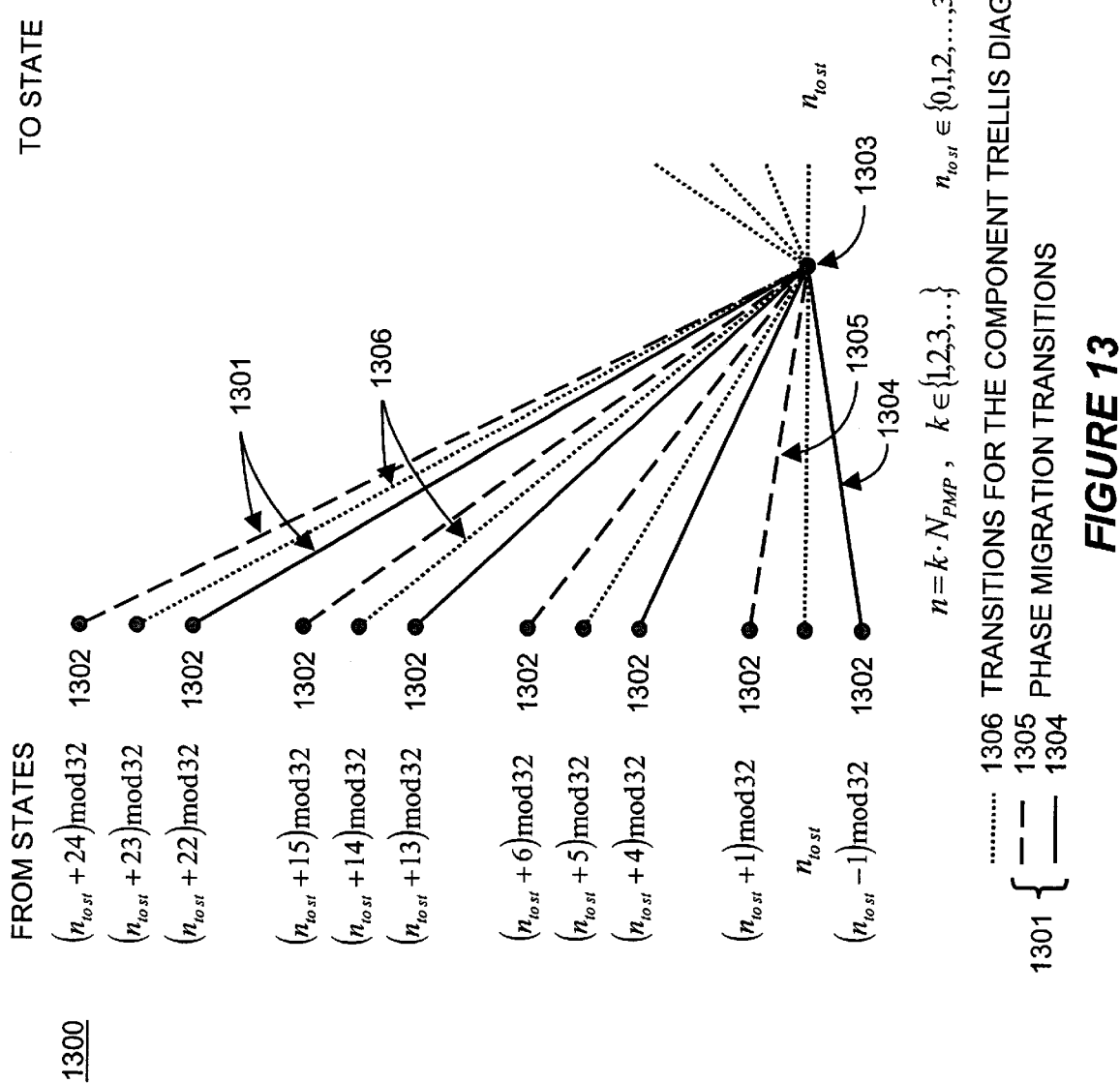
FIG. 13 illustrates one embodiment of a composite trellis diagram based on a single component trellis diagram for 4-ary, 1REC CPFSK, a signal modulation index value of 9/32 and a rigorous processing method.

FIG. 13 depicts an example composite trellis diagram 1300 for the 4-ary CPFSK, h=9/32 case that applies for rigorous processing methods. For brevity of presentation, FIG. 13 illustrates transitions to a generic to state in the composite trellis diagram, $n_{to\ st}$; the composite trellis diagram is actually comprised of thirty-two such diagrams—one for each value of $n_{to\ st}$. Note that composite trellis diagram 1300 is analogous to composite trellis diagram 400a of FIG. 4A, but composite trellis diagram 1300 is based on a single 32-state component trellis diagram that is identical to the root trellis diagram whereas composite trellis diagrams 400a is based on eight 4-state component trellis diagrams. Analogous to FIG. 4A, the dotted lines 1306 in FIG. 13 represent transitions in the single 32-state component trellis diagram for the present case. Furthermore, phase migration transitions 1301 each connect a migrate-from from-state 1302 in the component trellis diagram to a migrate-to to-state 1303 in the component trellis diagram. These phase migration transitions 1301 include migrate-up transitions 1304 and migrate-down transitions 1305. Migrate-up transitions 1304 each permit phase migration from a from state adjacent-to and below a from state for an associated from state to to state transition in the component trellis diagram to the to state for said associated transition. Migrate-down transitions 1305 each permit phase migration from a from state adjacent-to and above a from state for an associated from state to to state transition in the component trellis diagram to the to state for said associated transition.

Figure 14:
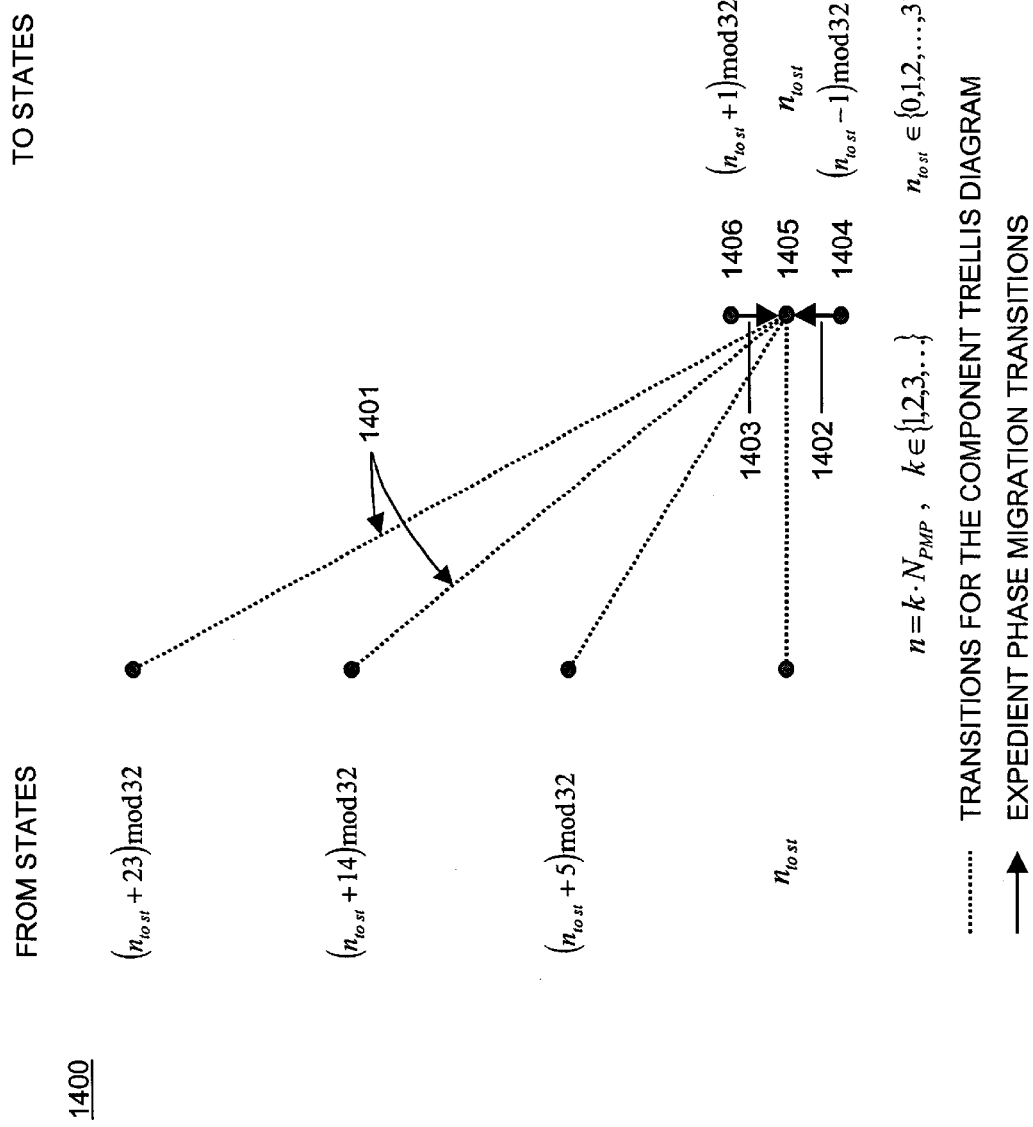
FIG. 14 is a simplified version of FIG. 13 that applies when an expedient processing method is used to generate path metric values.

Similarly, FIG. 14 depicts an example composite trellis diagram 1400 for the 4-ary CPFSK, h=9/32 case that is appropriate for expedient processing methods. Composite trellis diagram 1400 is analogous to composite trellis diagram 500a depicted in FIG. 5A. In FIG. 14, trellis transitions 1401 for the single component trellis diagram are shown as dotted lines. At the end of each phase migration period that spans $N_{PMP}$ modulation symbols, phase migration transitions 1402, 1403 concurrently connect migrate-from to-states 1404, 1406 to migrate-to to-states 1405. Phase migration transitions 1402 are migrate-up transitions and, thus, accommodate an increase in the undesired signal-phase, whereas phase migration transitions 1403 are migrate-down transitions and accommodate a decrease in the undesired signal-phase.

Reiterating, FIGS. 13 and 14 depict exemplary composite trellis diagrams 1300 and 1400 that correspond to composite trellis diagrams 400a and 500a of FIGS. 4A and 5A, respectively. Composite trellis diagrams that correspond to the composite trellis diagrams depicted in FIGS. 4B–4C and 5B–5C may be constructed in a similar fashion, as may other composite trellis diagrams. Furthermore, the 4-ary CPFSK, h=9/32 case is not limited to composite trellis diagrams based on a single component trellis diagram. For example, if 64 phase states rather than 32 phase states were selected for the composite trellis diagram, then a 64-state composite trellis diagram could be based on two 32-state component trellis diagrams that are phase-displaced versions of the root trellis diagram.

Application of the teachings of this invention to quaternary phase shift keying (QPSK), also called 4-ary PSK, is now described. A signal generated by an ideal QPSK modulator, an ideal QPSK signal, has a constant envelope and a modulation phase that equals one of four equispaced values in a $2\pi$ radians phase range during each modulation symbol interval. Its power spectrum exhibits first sidelobes about thirteen decibels lower in level than the main lobe of the spectrum. Typically, to improve spectrum utilization, the signal transmitted over the communication channel in a system which implements QPSK is a filtered version of an ideal QPSK signal, e.g., Nyquist filters can be used to achieve near-ideal spectrum properties. For clarity of presentation, an embodiment a CTP that processes an ideal QPSK signal is described most extensively herein. Other embodiments of CTPs which process filtered QPSK signals and both unfiltered and filtered m-ary PSK signals for values of m other than four are encompassed by this invention.

For ideal QPSK modulation, the desired component of the received signal is expressible as $$s(t) = A \cdot \sin[\omega_c \cdot t + \phi_m(t) + \phi_u(t)] \tag{31}$$

where, during the $n^{th}$ modulation symbol interval, $\phi_m(t)$ equals one of four constant values:

$$\phi_m(t) = \alpha_n \cdot \pi/2, \ \alpha_n \in \{0,1,2,3\}, \ (n-1) \cdot T_s < t \leq n \cdot T_s. \tag{32}$$

The values of modulation symbol $\alpha_n$ depend on the sequence of data bits transmitted and the data encoding convention implemented. For specificity, it is assumed that differential encoding and decoding are used to resolve a four-fold phase ambiguity associated with estimating the value of undesired signal-phase $\phi_u(t)$, and that Gray coding is used to minimize the number of user data bit errors for a given number of demodulated symbol errors. The sequence of user data bits transmitted is represented by $d_1, d_2, d_3, \ldots$ where each $d_n$ has a value of 0 or 1. To provide for the generation of estimated values of $d_1$ and $d_2$ at the receiver location (as required in many systems wherein signal bursts are transmitted), a differential coding reference dibit (a pair of bits) considered here to equal 00 is appended to the user data bit sequence at the transmitter to generate a transmit bit sequence 0, 0, $d_1, d_2, d_3, \ldots$. Since two bits are transmitted via each QPSK modulation symbol, a sequence of dibits, $D_1, D_2, D_3, \ldots$, is formed from the transmit bit sequence where $D_1=0\ 0$, $D_2=d_1\ d_2$, $D_3=d_3\ d_4$, $\ldots$. For n greater than one, $D_n=d_{(2n-3)}d_{(2n-2)}$. All dibit values $D_n$ are Gray encoded to form dibit values $C_n$ given by $$C_n = d_{(2n-3)}(d_{(2n-3)} \oplus d_{(2n-2)}) \text{ for } n>1 \text{ and } C_1=0\ 0 \text{ (or simply 0)} \tag{33}$$

where $\oplus$ designates the Exclusive OR operation and $C_n \in \{00, 01, 10, 11\}$ or, equivalently, $C_n \in \{0,1,2,3\}$. Differential encoding is effected by adding $C_n$ to the value of $\alpha_n$ for the preceding modulation symbol interval modulo four. Thus, $$\alpha_n = (C_n + \alpha_{(n-1)}) \bmod 4 \text{ where } C_n \in \{0,1,2,3\} \text{ and } \alpha_0 \equiv 0. \tag{34}$$

Figure 10:
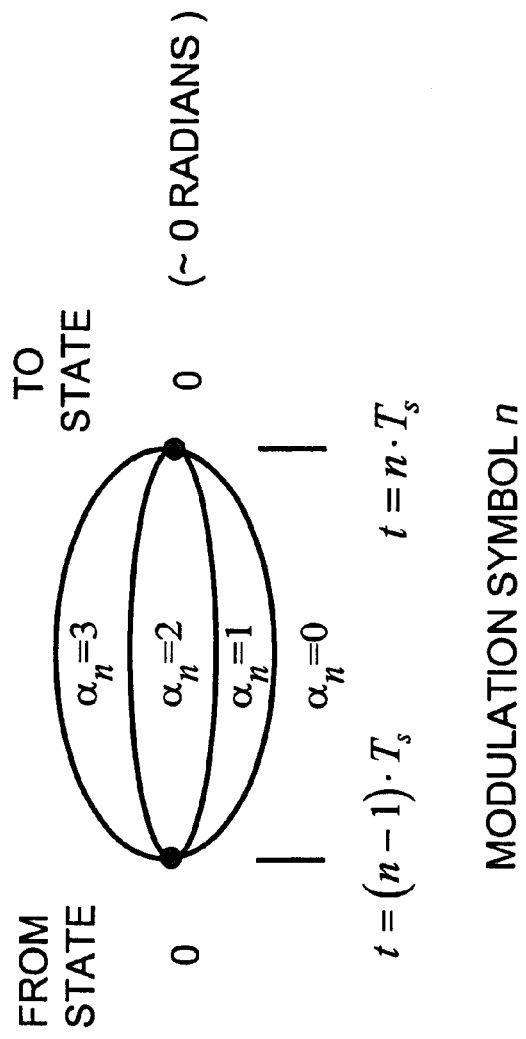
FIG. 10 is a one-state root trellis diagram for QPSK that applies for an arbitrary (single) modulation interval.
Figure 11:
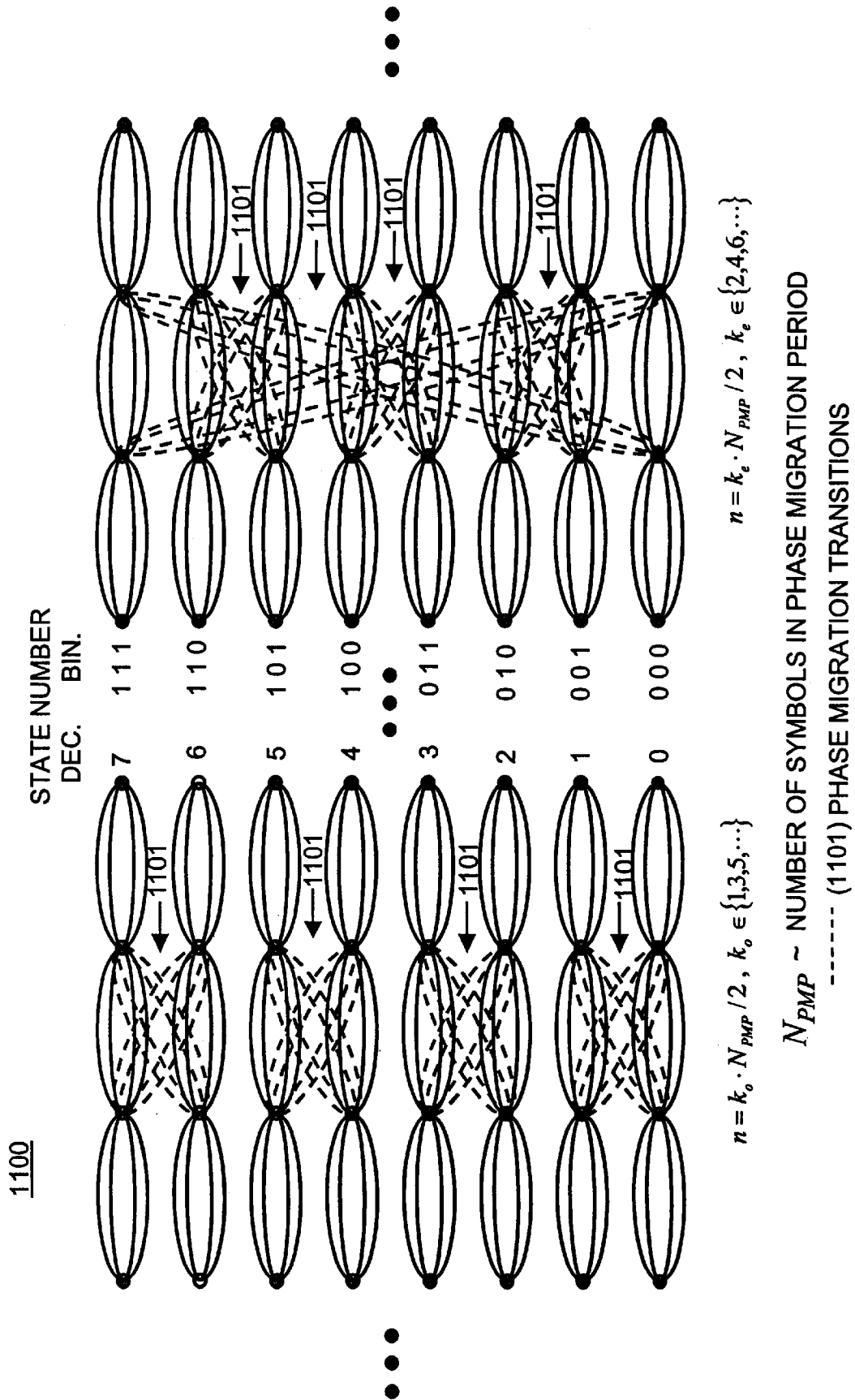
FIG. 11 is an eight-state composite trellis diagram that illustrates one embodiment of phase migration transitions for a Composite-Trellis Processor in accordance with the present invention for QPSK.

Either of multiple root trellis diagrams can be used as a basis for implementing a CTP 602 that processes a QPSK signal generated as described in the preceding paragraph. The most obvious applicable root trellis diagram is comprised of four states, one state for each value of $\alpha_n$, for which phase state values are multiples of $\pi/2$ radians and state transitions connect each from state to all four to states. For QPSK, the degradation in BEP performance for a CTP 602 that results from phase quantization error equals a few tenths of a decibel when thirty-two phase states span a $2\pi$ radians range and about one-tenth a decibel or less when sixty-four phase states span the same range. For applications where thirty-two phase states provides an appropriate tradeoff between BEP performance loss and implementation complexity, a composite trellis diagram can be formed from eight component trellis diagrams that are each a phase displaced version of the aforesaid four-state root trellis diagram. However, without compromising CTP 602 performance, a nominal four-fold reduction in implementation complexity derives from representing the signal's phase modulo $\pi/2$ radians. For such a representation the root trellis diagram 1000 is comprised of a single state as illustrated in FIG. 10. A corresponding eight-state composite trellis diagram 1100 for a CTP 602 is shown in FIG. 11 for multiple symbol intervals and phase migration transitions 1101 of the type indicated in FIG. 4B. Since the signal's phase is represented modulo $\pi/2$ radians, the signal phase associated with a trellis (phase) state equals the state number multiplied by $\pi/16$ radian.

Figure 12:
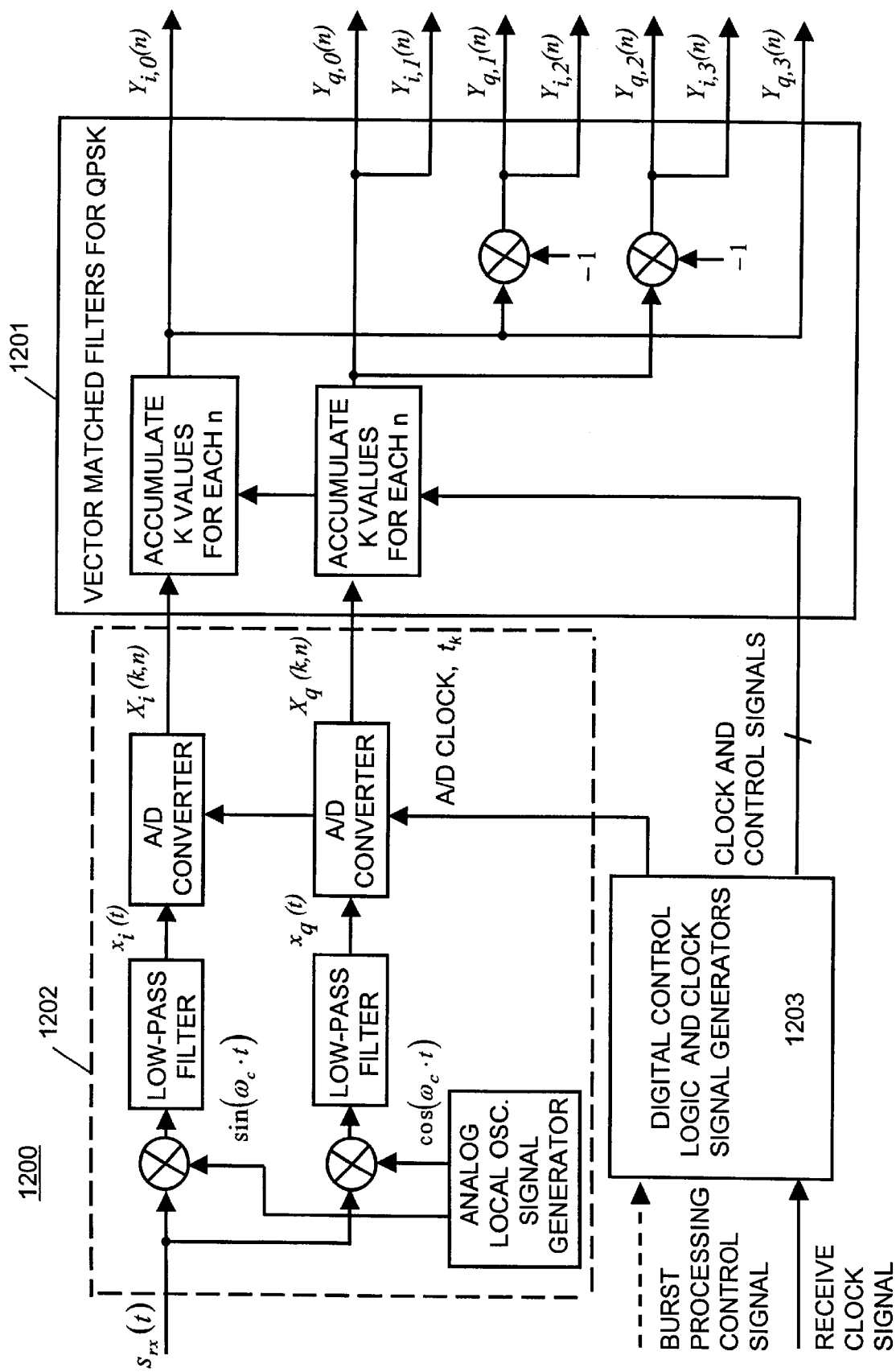
FIG. 12 is a block diagram of a modified version of the Receiver and Vector Matched Filters illustrated in FIG. 7A for one application of the present invention to QPSK.

For QPSK, the signals (effectively) generated locally for use in generating vector matched filter signals are expressible by Equation 7 where, when an expedient processing method is used to implement CTP 602, $$\phi_{l,n_{tt}}(t)=\phi_{l,n_{tt}}\equiv\phi_{l,\alpha_n}=\alpha_n\cdot\pi/2 \text{ and} \quad (35)$$

$$\phi_{lc}(n,n_{st})=\phi_{lc}(n_{st})=n_{st}\cdot\pi/16 \text{ where}$$

$$n_{st}\in\{0,1,2,3,4,5,6,7\} \quad (36)$$

for each modulation symbol processed. Note that trellis transition identification number $n_{tt}$ is defined as being equal to the of value $\alpha_n$ for the trellis transition in Equation 35. Vector matched filters 1201 (shown in FIG. 12) generate output signals $Y_{i,\alpha_n}(n)$ and $Y_{q,\alpha_n}(n)$ in accord with either Equations 11, 12 and 35 or Equations 18, 19 and 35. A block diagram for one embodiment of circuits 1200 for which the latter equations apply is shown in FIG. 12. Circuit 1200 includes a receiver 1202, control module 1203 and vector matched filters 1201. Other embodiments of vector matched filters 1201 obviously apply; for example, when signal filtering is effected, signals $Y_{i,0}(n)$ and $Y_{q,0}(n)$ can be generated by "root raised cosine" Nyquist filters. Irrespective of how the vector matched filters 1201 are implemented, branch metric values are calculated from the vector matched filter output signals using Equations 8 and 36. Alternatively, since $\phi_{l,\alpha_n}$ does not vary with time during a (any) modulation symbol interval, branch metric values can be determined from signals $Y_{i,0}(n)$ and $Y_{q,0}(n)$ only using the expression $$m_{n_{st},\alpha_n}(n) = \quad (37)$$
$$Y_{i,0}(n)\cdot\cos\left[\alpha_n\cdot\frac{\pi}{2}+n_{st}\cdot\frac{\pi}{16}\right]+Y_{q,0}(n)\cdot\sin\left[\alpha_n\cdot\frac{\pi}{2}+n_{st}\cdot\frac{\pi}{16}\right].$$

Candidate path metric values are generated in accord with the Viterbi algorithm as described above for 4-ary CPFSK. In turn, values for provisional path metrics are selected from appropriate candidate path metric values and updated path metric values are selected there from as appropriate for the phase migration transition configuration implemented.

For the QPSK composite trellis diagram 1100 illustrated in FIG. 11, either of four values of $\alpha_n$ apply for each allowed combination of from state and to state values. Thus, for indirect path history generation, values of $\alpha_n$ for winning state transitions generally must be stored as path history data in addition to winning from state values (or values which can be used to determine from state values from applicable to state values). For direct path history generation, winning hypothesized values of $\alpha_n$, $\hat{\alpha}_n(n_{st})$, are determined and stored for all states in the composite trellis diagram 1100. Then, for one embodiment of this invention, estimated values of Gray encoded dibits $C_n$, $\hat{C}_n(n_{st})$, are generated for all trellis states by differentially decoding successive values of $\hat{\alpha}_n(n_{st})$; that is $$\hat{C}_n(n_{st})=[\hat{\alpha}_n(n_{st})-4]\mod 4, n>1. \quad (38)$$

For each trellis state, a data path history 902 value is generated that represents either a succession of $\hat{C}_n(n_{st})$ values or Gray decoded versions thereof for nominally eight to sixteen most recently processed modulation symbols. When a data path history 902 value is comprised of Gray decoded dibit values designated by $\hat{D}_n(n_{st})$, values for bits $\hat{d}_{(2n-3)}(n_{st})$ and $\hat{d}_{(2n-2)}(n_{st})$ that comprise $\hat{D}_n(n_{st})$ are generated by Gray decoding bits $\hat{c}_{(2n-3)}(n_{st})$ and $\hat{d}_{(2n-2)}(n_{st})$ that comprise $\hat{c}_n(n_{st})$:

$$\hat{d}_{(2n-3)}(n_{st})=\hat{c}_{(2n-3)}(n_{st}), n>1 \text{ and} \quad (39)$$

$$\hat{d}_{(2n-2)}(n_{st})=\hat{c}_{(2n-3)}(n_{st})\oplus\hat{c}_{(2n-2)}(n_{st}), n>1. \quad (40)$$

Correspondingly, the bit values that comprise the Demodulated Data Stream are taken directly as the oldest dibit values stored in data path history 902 words for successive winning trellis states, i.e., for successive trellis states having the largest path metric values. When a data path history 902 word is comprised of $\hat{C}_n(n_{st})$ values, the oldest dibit values stored in data path history 902 words for successive winning trellis states are read from memory and Gray decoded in accord with Equations 39 and 40 to generate bit values that comprise the Demodulated Data Stream. The operations performed to update the values of data path history 902 words when phase migration transitions are allowed are the same as described previously for 4-ary CPFSK embodiments of this invention.

For QPSK, Undesired Signal-Phase Estimates can be generated as described previously for 4-ary CPFSK embodiments with each trellis id path history 901 value representing multiple state numbers in their entirety rather than "partial" state numbers—although three-bit values are stored in both cases. However, for some applications of this invention, a preferred tradeoff between performance and implementation complexity can be achieved by effectively setting the trellis traceback depth for generating Undesired Signal-Phase Estimates equal to zero; that is, current values for successive winning trellis states can be used to generate Undesired Signal-Phase Estimates rather than "old" state values stored in trellis id path history 901 words. For either case, the value of the Undesired Signal-Phase Estimates equals the appropriate winning state number multiplied by $\pi/16$ radian for the example QPSK embodiment described herein.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A trellis processing method for processing digitally modulated signal having an unknown and undesired phase component over a succession of processing intervals, comprising:

generating path metrics in accordance with a composite trellis diagram having a plurality of states, each path metric being indicative of a likelihood associated with a path through the composite trellis diagram to an associated state in the composite trellis diagram, the likelihood being determined responsive to the signal processed, the composite trellis diagram including:

exactly one component trellis diagram that is a phase displaced version of a root trellis diagram which spans a plurality of processing intervals; and a plurality of phase migration transitions each connecting a "from state" in the component trellis diagram to a "to state" in the component trellis diagram indicating that phase migration is permitted between said "from state" and said "to state".

2. The method of claim 1 further comprising:

determining path history information for states in said composite trellis diagram over the succession of processing intervals for which said path metrics are generated; and deriving a demodulated symbol sequence from the path history information.

3. The method of claim 2 wherein each phase migration transition recurs periodically not more often than once every two consecutive processing intervals.

4. The method of claim 3 wherein the "from state" and the "to state" associated with each phase migration transition apply to a common time state and further comprising, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time concurrent states connected therewith by phase migration transitions.

5. The method of claim 4 further comprising limiting phase migration transitions to connect "from states" and "to states" that are phase-adjacent.

6. The method of claim 3 wherein the path metrics are generated in rigorous accord with the composite trellis diagram.

7. The method of claim 6 further comprising limiting phase migration transitions to each connect a "from state" that is phase-adjacent to a "from state" for an associated "from state" to "to state" transition in the component trellis diagram to the "to state" for said associated transition.

8. The method of claim 3 further comprising limiting phase migration transitions to each accommodate an increase or decrease in the undesired phase component of the signal by an amount equal to the absolute value of the difference between phase values for adjacent phase states.

9. The method of claim 8 wherein the "from state" and the "to state" associated with each phase migration transition apply at a common time state and further comprising, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

10. The method of claim 8 wherein the path metrics are generated in rigorous accord with the composite trellis diagram.

11. The method of claim 1 further comprising:

determining path history information for states in said composite trellis diagram over the succession of processing intervals for which said path metrics are generated; and estimating changes in the unknown and undesired phase component from the path history information.

12. The method of claim 11 wherein each phase migration transition recurs periodically not more often than once every two consecutive processing intervals.

13. The method of claim 12 wherein the "from state" and the "to state" associated with each phase migration transition apply to a common time state and further comprising, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

14. The method of claim 13 further comprising limiting phase migration transitions to connect "from states" and "to states" that are phase-adjacent.

15. The method of claim 12 wherein the path metrics are generated in rigorous accord with the composite trellis diagram.

16. The method of claim 15 further comprising limiting phase migration transitions to each connect a "from state"

that is phase-adjacent to a "from state" for an associated "from state" to "to state" transition in the component trellis diagram to the "to state" for said associated transition.

17. The method of claim 12 further comprising limiting phase migration transitions to each accommodate an increase or decrease in the undesired phase component of the signal by an amount equal to the absolute value of the difference between phase values for adjacent phase states.

18. The method of claim 17 wherein the "from state" and the "to state" associated with each phase migration transition apply to a common time state and further comprising, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

19. The method of claim 17 wherein the path metrics are generated in rigorous accord with the composite trellis diagram.

20. The method of claim 2 wherein the "from state" and the "to state" associated with each phase migration transition apply to a common time state and further comprising, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

21. The method of claim 20 further comprising limiting phase migration transitions to connect "from states" and "to states" that are phase-adjacent.

22. The method of claim 21 wherein each phase migration transition recurs periodically not more often than once every two consecutive processing intervals.

23. The method of claim 20 wherein each phase migration transition recurs periodically not more often than once every two consecutive processing intervals.

24. The method of claim 23 further comprising limiting phase migration transitions to connect "from states" and "to states" that are phase-adjacent.

25. The method of claim 11 wherein the "from state" and the "to state" associated with each phase migration transition apply to a common time state and further comprising, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

26. The method of claim 25 further comprising limiting phase migration transitions to connect "from states" and "to states" that are phase-adjacent.

27. The method of claim 26 wherein each phase migration transition recurs periodically not more often than once every two consecutive processing intervals.

28. The method of claim 25 wherein each phase migration transition recurs periodically not more often than once every two consecutive processing intervals.

29. The method of claim 28 further comprising limiting phase migration transitions to connect "from states" and "to states" that are phase-adjacent.

30. The method of claim 2 wherein the digitally modulated signal is a burst signal having an unknown and undesired phase component over a succession of processing intervals that span a plurality of signal bursts.

31. The method of claim 30 wherein the "from state" and the "to state" associated with each phase migration transition apply to a common time state and further comprising, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

32. The method of claim 30 wherein each phase migration transition recurs periodically not more often than once every two consecutive processing intervals.

33. The method of claim 32 wherein the "from state" and the "to state" associated with each phase migration transition apply to a common time state and further comprising, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

34. The method of claim 11 wherein the digitally modulated signal is a burst signal having an unknown and undesired phase component over a succession of processing intervals that span a plurality of signal bursts.

35. The method of claim 34 wherein the "from state" and the "to state" associated with each phase migration transition apply to a common time state and further comprising, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

36. The method of claim 34 wherein each phase migration transition recurs periodically not more often than once every two consecutive processing intervals.

37. The method of claim 36 wherein the "from state" and the "to state" associated with each phase migration transition apply to a common time state and further comprising, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

38. A trellis processing method for processing a digitally modulated burst signal having an unknown and undesired phase component over a succession of processing intervals that span a plurality of signal bursts, comprising:

generating path metrics in accordance with a composite trellis diagram having a plurality of states, each path metric being indicative of a likelihood associated with a surviving path through the composite trellis diagram to an associated state in the composite trellis diagram, the likelihood being determined responsive to the burst signal processed, the composite trellis diagram including:

exactly one component trellis diagram that is a phase displaced version of a root trellis diagram which spans a plurality of processing intervals;

for each signal burst, determining path history information for states in said composite diagram over the succession of processing intervals for which said path metrics are generated; and for each signal burst, deriving a demodulated symbol sequence from the path history information.

39. A system for processing a digitally modulated signal having an unknown and undesired phase component, comprising:

a receiver module for receiving the digitally modulated signal and generating a succession of vector matched filtered output signal samples there from;

a composite trellis processor (CTP) coupled to the receiver module for performing a CTP method comprising:

generating path metrics in accordance with a composite trellis diagram having a plurality of states, each path metric being indicative of a likelihood associated with a path through the composite trellis diagram to an associated state in the composite trellis diagram, the likelihood being determined responsive to the succession of signal samples, the composite trellis diagram including:

exactly one component trellis diagram that is a phase displaced version of a root trellis diagram which spans a plurality of processing intervals; and a plurality of phase migration transitions each connecting a "from state" in the component trellis diagram to a "to state" in the component trellis diagram indicating that phase migration is permitted between said "from state" and said "to state".

40. The system of claim 39 wherein the CTP method further comprises:

determining path history information for states in said composite trellis diagram over the succession of processing intervals for which said path metrics are generated; and deriving a demodulated symbol sequence from the path history information.

41. The system of claim 40 wherein each phase migration transition recurs periodically not more often than once every two consecutive processing intervals.

42. The system of claim 41 wherein the "from state" and the "to state" associated with each phase migration transition apply to a common time state and wherein the CTP method further comprises, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

43. The system of claim 42 wherein the CTP method further comprises limiting phase migration transitions to connect "from states" and "to states" that are phase-adjacent.

44. The system of claim 41 wherein the path metrics are generated in rigorous accord with the composite trellis diagram.

45. The system of claim 44 wherein the CTP method further comprises limiting phase migration transitions to each connect a "from state" that is phase-adjacent to a "from state" for an associated "from state" to "to state" transition in the component trellis diagram to the "to state" for said associated transition.

46. The system of claim 41 wherein the CTP method further comprises limiting phase migration transitions to each accommodate an increase or decrease in the undesired phase component of the signal by an amount equal to the absolute value of the difference between phase values for adjacent phase states.

47. The system of claim 46 wherein the "from state" and the "to state" associated with each phase migration transition apply to a common time state and wherein the CTP method further comprises, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

48. The system of claim 46 wherein the path metrics are generated in rigorous accord with the composite trellis diagram.

49. The system of claim 39 wherein the CTP method further comprises:

determining path history information for states in said composite trellis diagram over the succession of processing intervals for which said path metrics are generated; and estimating changes in the unknown and undesired phase component from the path history information.

50. The system of claim 49 wherein each phase migration transition recurs periodically not more often than once every two consecutive processing intervals.

51. The system of claim 50 wherein the "from state" and the "to state" associated with each phase migration transition apply to a common time state and wherein the CTP method further comprises, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

52. The system of claim 51 wherein the CTP method further comprises limiting phase migration transitions to connect "from states" and "to states" that are phase-adjacent.

53. The system of claim 50 wherein the path metrics are generated in rigorous accord with the composite trellis diagram.

54. The system of claim 53 wherein the CTP method further comprises limiting phase migration transitions to each connect a "from state" that is phase-adjacent to a "from state" for an associated "from state" to "to state" transition in the component trellis diagram to the "to state" for said associated transition.

55. The system of claim 50 wherein the CTP method further comprises limiting phase migration transitions to each accommodate an increase or decrease in the undesired phase component of the signal by an amount equal to the absolute value of the difference between phase values for adjacent phase states.

56. The system of claim 55 wherein the "from state" and the "to state" associated with each phase migration transition apply to a common time state and wherein the CTP method further comprises, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

57. The system of claim 55 wherein the path metrics are generated in rigorous accord with the composite trellis diagram.

58. The system of claim 40 wherein the "from state" and the "to state" associated with each phase migration transition apply to a common time state and wherein the CTP method further comprises, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

59. The system of claim 58 wherein the CTP method further comprises limiting phase migration transitions to connect "from states" and "to states" that are phase-adjacent.

60. The system of claim 59 wherein each phase migration transition recurs periodically not more often than once every two consecutive processing intervals.

61. The system of claim 58 wherein each phase migration transition recurs periodically not more often than once every two consecutive processing intervals.

62. The system of claim 61 further comprising limiting phase migration transitions to connect "from states" and "to states" that are phase-adjacent.

63. The system of claim 49 wherein the "from state" and the "to state" associated with each phase migration transition apply to a common time state and wherein the CTP method further comprises, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

64. The system of claim 63 wherein the CTP method further comprises limiting phase migration transitions to connect "from states" and "to states" that are phase-adjacent.

65. The system of claim 64 wherein each phase migration transition recurs periodically not more often than once every two consecutive processing intervals.

66. The system of claim 63 wherein each phase migration transition recurs periodically not more often than once every two consecutive processing intervals.

67. The system of claim 66 wherein the CTP method further comprises limiting phase migration transitions to connect "from states" and "to states" that are phase-adjacent.

68. The system of claim 40 wherein the digitally modulated signal is a burst signal having an unknown and undesired phase component over a succession of processing intervals that span a plurality of signal bursts.

69. The system of claim 68 wherein the "from state" and the "to state" associated with each phase migration transition apply to a common time state and wherein the CTP method further comprises, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and any time-concurrent states connected therewith by phase migration transitions.

70. The system of claim 68 wherein each phase migration transition recurs periodically not more often than once every two consecutive processing intervals.

71. The system of claim 70 wherein the "from state" and the "to state" associated with each phase migration transition apply to a common time state and wherein the CTP method further comprises, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent stated connected therewith by phase migration transitions.

72. The system of claim 49 wherein the digitally modulated signal is a burst signal having an unknown and undesired phase component over a succession of processing intervals that span a plurality of signal bursts.

73. The system of claim 72 wherein the "from state" and the "to state" associated with each phase migration transition apply to a common time state and wherein the CTP method further comprises, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

74. The system of claim 72 wherein each phase migration transition recurs periodically not more often than once every two consecutive processing intervals.

75. The system of claim 74 wherein the "from state" and the "to state" associated with each phase migration transition apply to a common time state and wherein the CTP method further comprises, for each processing interval, generating updated path metrics in accordance with an expedient processing method comprising:

generating a provisional path metric for each "to state", each provisional path metric corresponding to the path metric indicating the highest likelihood path within the component trellis diagram associated with the "to state";

for each trellis "to state" not connected to any state by a phase migration transition, selecting the provisional path metric for the "to state" as the updated path metric; and for each trellis "to state" connected to at least one other state by at least one phase migration transition, selecting as the updated path metric the path metric indicating the highest likelihood path from among the provisional path metrics for the "to state" and all time-concurrent states connected therewith by phase migration transitions.

76. A system for processing a digitally modulated burst signal having an unknown and undesired phase component over a succession of processing intervals that span a plurality of signal bursts, comprising:

a receiver module for receiving the digitally modulated signal and generating a succession of vector matched filtered output signal samples there from;

a composite trellis processor (CTP) coupled to the receiver module for performing a CTP method comprising:

generating path metrics in accordance with a composite trellis diagram having a plurality of states, each path metric being indicative of a likelihood associated with a path through the composite trellis diagram to an associated state in the composite trellis diagram, the likelihood being determined responsive to the succession of signal samples, the composite trellis diagram including:

exactly one component trellis diagram that is a phase displaced version of a root trellis diagram which spans a succession of processing intervals;

for each signal burst, determining path history information for states in said composite trellis diagram over the succession of processing intervals for which said path metrics are generated; and for each signal burst, deriving a demodulated symbol sequence from the path history information.

* * * * *